US011073554B2

(12) United States Patent
Azam et al.

(10) Patent No.: US 11,073,554 B2
(45) Date of Patent: Jul. 27, 2021

(54) HARDWARE-BASED LOCAL-STATE RETENTION FAULT DETECTION

(71) Applicant: Intel Corporation, Santa Clara, CA (US)

(72) Inventors: Asad Azam, Folsom, CA (US); Dhinesh A/L Sasidaran, Bayan Lepas (MY); R Selvakumar Raja Gopal, Tapah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/586,731

(22) Filed: Sep. 27, 2019

(65) Prior Publication Data
US 2020/0025825 A1 Jan. 23, 2020

(51) Int. Cl.
*G01R 31/28* (2006.01)
*G01R 31/3177* (2006.01)
*G01R 31/317* (2006.01)
*G06F 11/10* (2006.01)

(52) U.S. Cl.
CPC ... *G01R 31/3177* (2013.01); *G01R 31/31724* (2013.01); *G06F 11/1004* (2013.01)

(58) Field of Classification Search
CPC .......... G01R 31/3177; G01R 31/31724; G06F 11/1004
See application file for complete search history.

(56) References Cited

U.S. PATENT DOCUMENTS

2010/0269004 A1* 10/2010 Flynn ..................... G06F 11/10
714/746

* cited by examiner

*Primary Examiner* — Samir W Rizk
(74) *Attorney, Agent, or Firm* — Schwegman Lundberg & Woessner, P.A.

(57) ABSTRACT

Apparatuses of a scan controller include memory and circuitry, where the circuitry is configured to respond to a first signal by sending a second signal to isolate state retention elements from non-state retention elements in a scan chain of power gating circuitry and cycling through the scan chain while obtaining state retention data from the state retention elements during each cycle. The circuitry may be further configured to determine a first error detection code from the state retention data and store the error detection code in the memory. The circuitry may be configured to determine a second error detection code in response to another signal and compare the first error detection code with the second error detection code. The circuitry may be configured to send a signal indicating that the state retention data is corrupted if the first error detection code does not match the second error detection code.

25 Claims, 19 Drawing Sheets

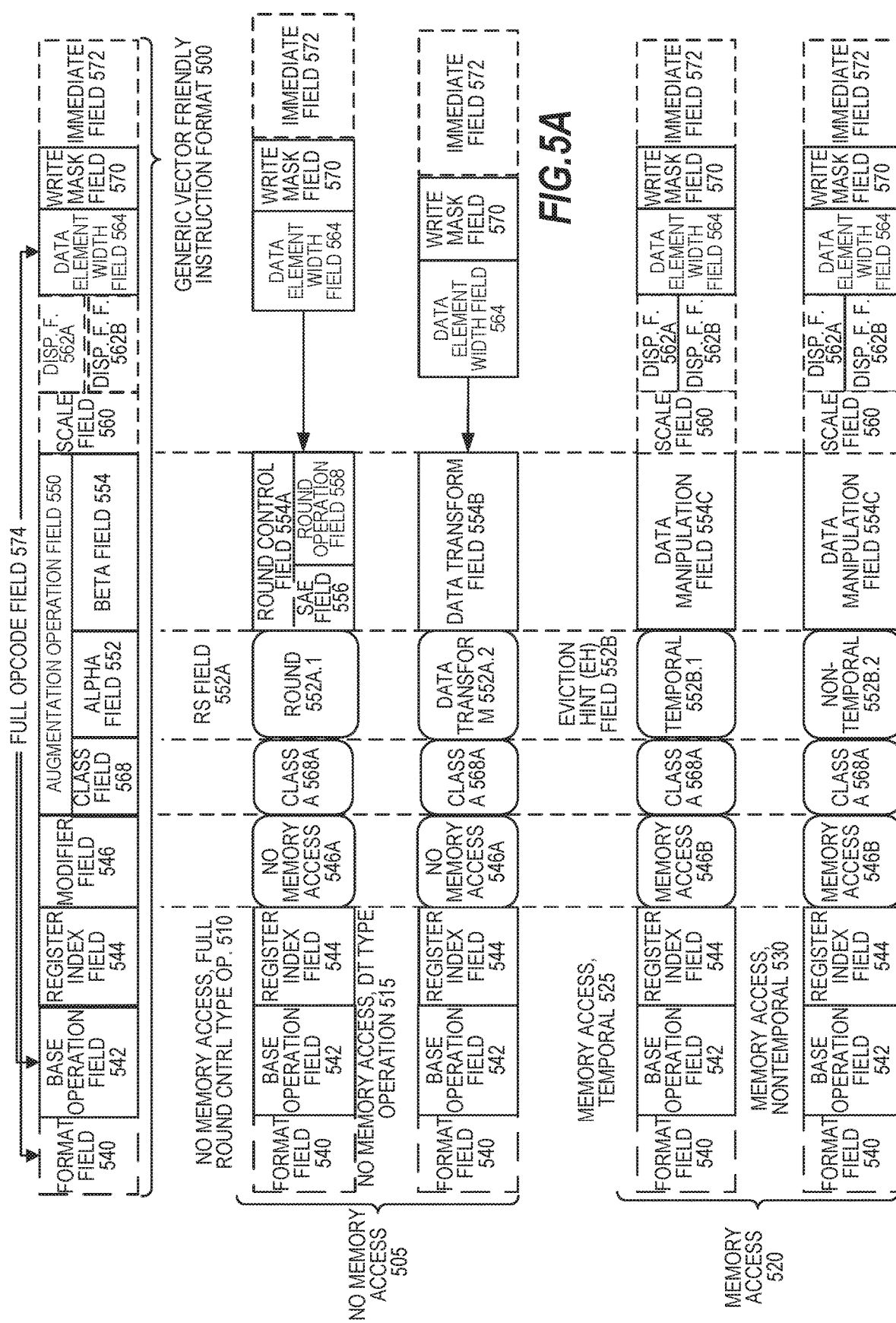

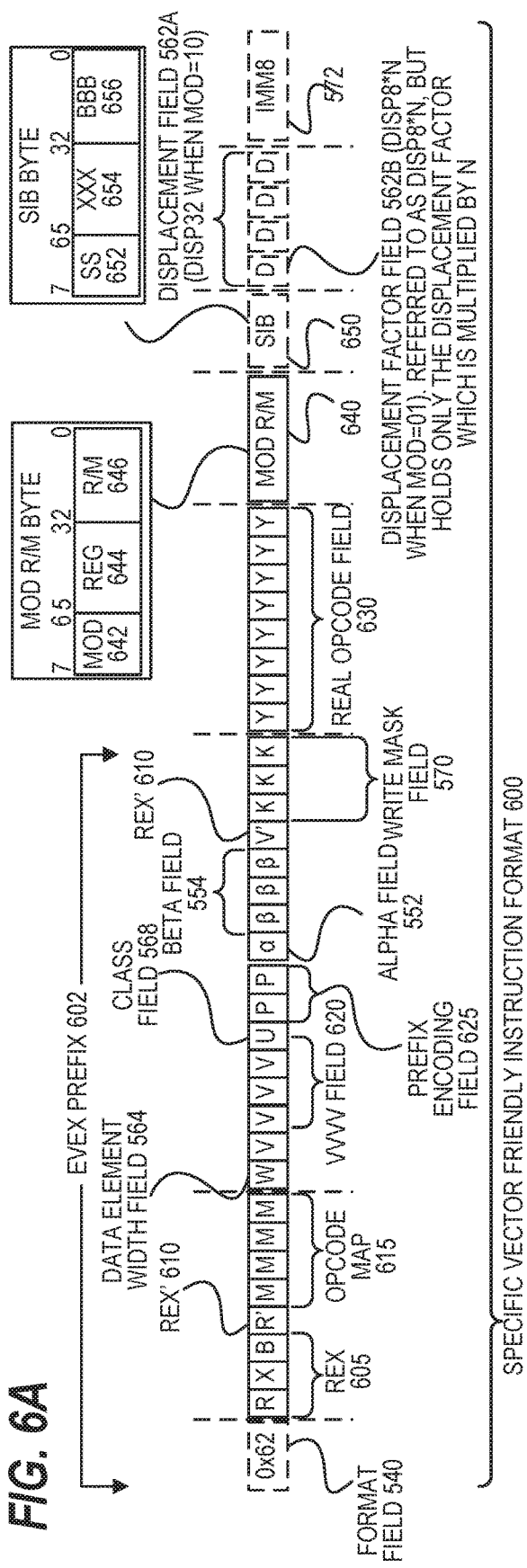
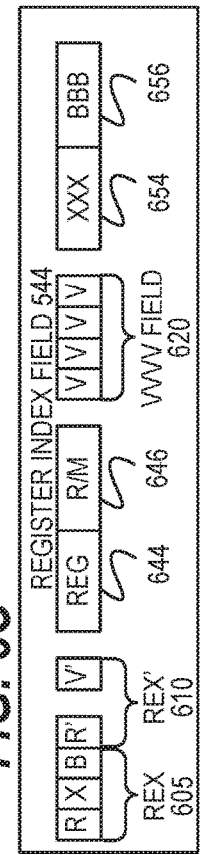
FIG. 6A
FIG. 6B
FIG. 6C

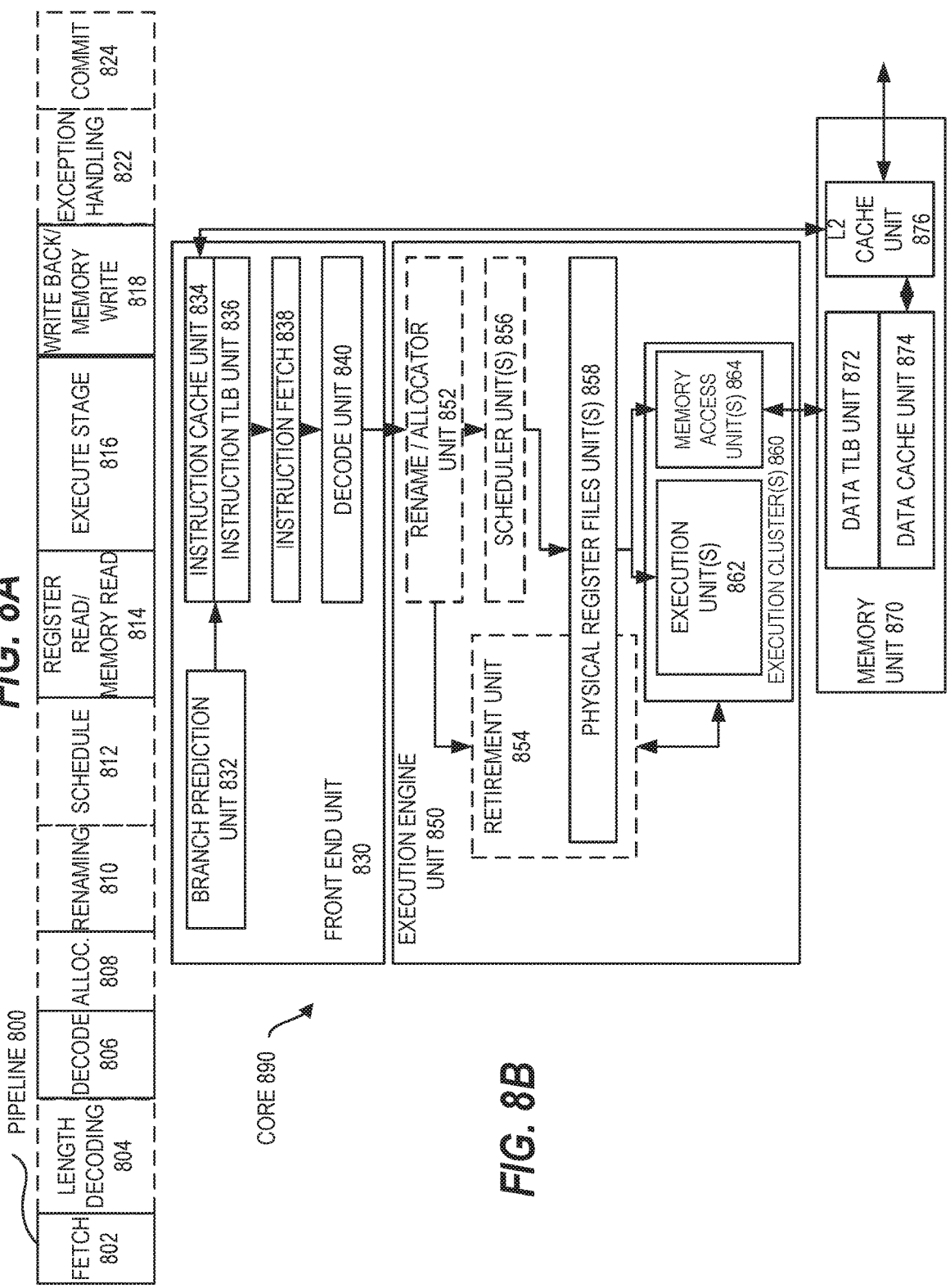

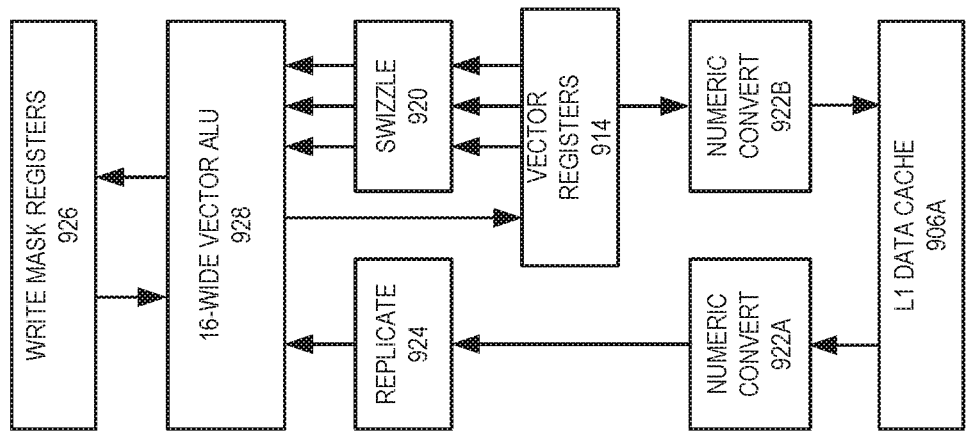
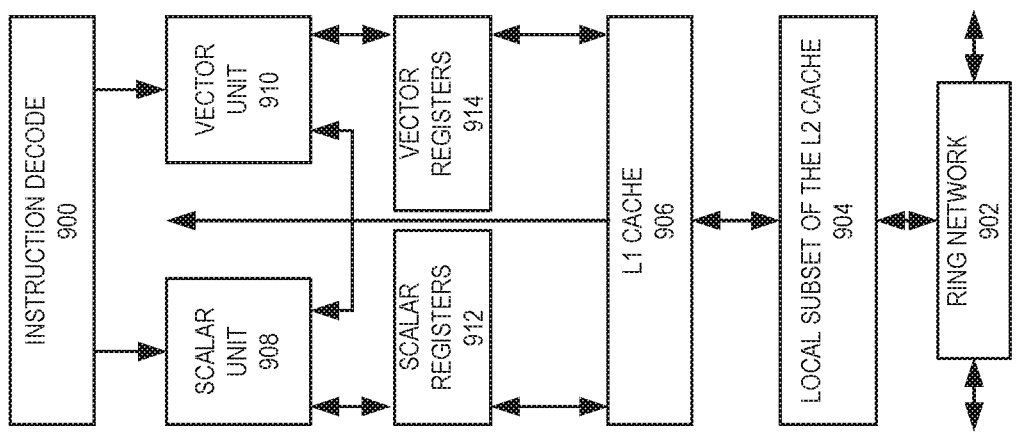
FIG. 9B
FIG. 9A

HARDWARE-BASED LOCAL-STATE RETENTION FAULT DETECTION

TECHNICAL FIELD

Embodiments relate to hardware-based local-state retention fault detection. Some embodiments relate to hardware-based local-state retention fault detection for systems that use power gating.

BACKGROUND

Power gating turns off power to some portions of a system to reduce power leakage. Power gating maintains power to other portions of the system for state retention. State retention of a portion of the system enables the entire system to power up quicker while turning off power to portions of the system enables the system to operate in an idle state while consuming less power. However, to be competitive, often systems must be operated with aggressive power saving, which may increase the likelihood that a value of the state retention portion of the system is corrupted during power gating. Additionally, some systems may need to consume less power and yet must operate within strict safety standards.

BRIEF DESCRIPTION OF THE DRAWINGS

The present disclosure is illustrated by way of example and not limitation in the figures of the accompanying drawings, in which like references indicate similar elements and in which:

FIGS. 3A and 3B illustrate a method for hardware-based local-state retention fault detection, in accordance with some embodiments;

FIGS. 5A-5B are block diagrams illustrating a generic vector friendly instruction format and instruction templates thereof according to an embodiment;

FIGS. 6A-6D are block diagrams illustrating a specific vector friendly instruction format according to an embodiment;

FIG. 8A is a block diagram illustrating both an in-order pipeline and a register renaming, out-of-order issue/execution pipeline according to an embodiment;

FIG. 8B is a block diagram illustrating both an in-order architecture core and a register renaming, out-of-order issue/execution architecture core to be included in a processor according to an embodiment;

FIGS. 9A-9B illustrate block diagrams of a more specific in-order core architecture, which core would be one of several logic blocks (including other cores of the same type and/or different types) in a chip, according to an embodiment;

DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Systems, integrated circuitry, computer readable media, and methods are provided for hardware-based local-state retention fault detection. In some embodiments, a hybrid scan controller, power-gating controller, and safety handler are configured to determine a cyclic redundancy code (CRC) of retention states before power gating and after power gating. In some embodiments, a different error detecting code may be used. In some embodiments, multiplexers (MUXs) are used to isolate state retention elements (elements that receive power during low power or power saving states) from non-state retention elements (e.g., elements that are powered down). The state retention elements may be connected so that a cyclic scan may be performed to scan in the values of the state retention elements and calculate an error detecting code using the values.

A technical problem arises in determining whether the retention states, e.g., finite state machines (FSMs), internal flags, status, logic enabling safety mechanisms, etc., have maintained their values during a low power state. Diagnostic applications that rely on testing the functionality of the system to determine whether retention states have maintained their values often are too time consuming and may not be comprehensive. Additionally, the functionality of the system may be complex so that comprehensive functional testing may be impractical. For example, the functional testing may be time consuming and the system may be part of a real-time system.

Another technical problem arises in ensuring that the system maintains a safe operating mode before and after the low power states, i.e., before and after the power gating. For example, the system may need to meet system on a chip (SOC) safety requirements. The system may need to be able to go into low power states and be able to enter and exit the low power states quickly. However, the functional diagnostic procedures are often time consuming and may consume a lot of power performing the diagnostics. Additionally, data corruption of the retention states may not be determined immediately. For example, functional fault may occur due to data corruption of the retention states that is not detected until the functions are actually performed. Functional faults that may not be discovered immediately after powering back up may be termed latent functional faults. Some embodiments of the systems, computer readable media, and methods for hardware-based local-state retention fault detection disclosed herein solve the technical problems disclosed herein.

Figure 1:
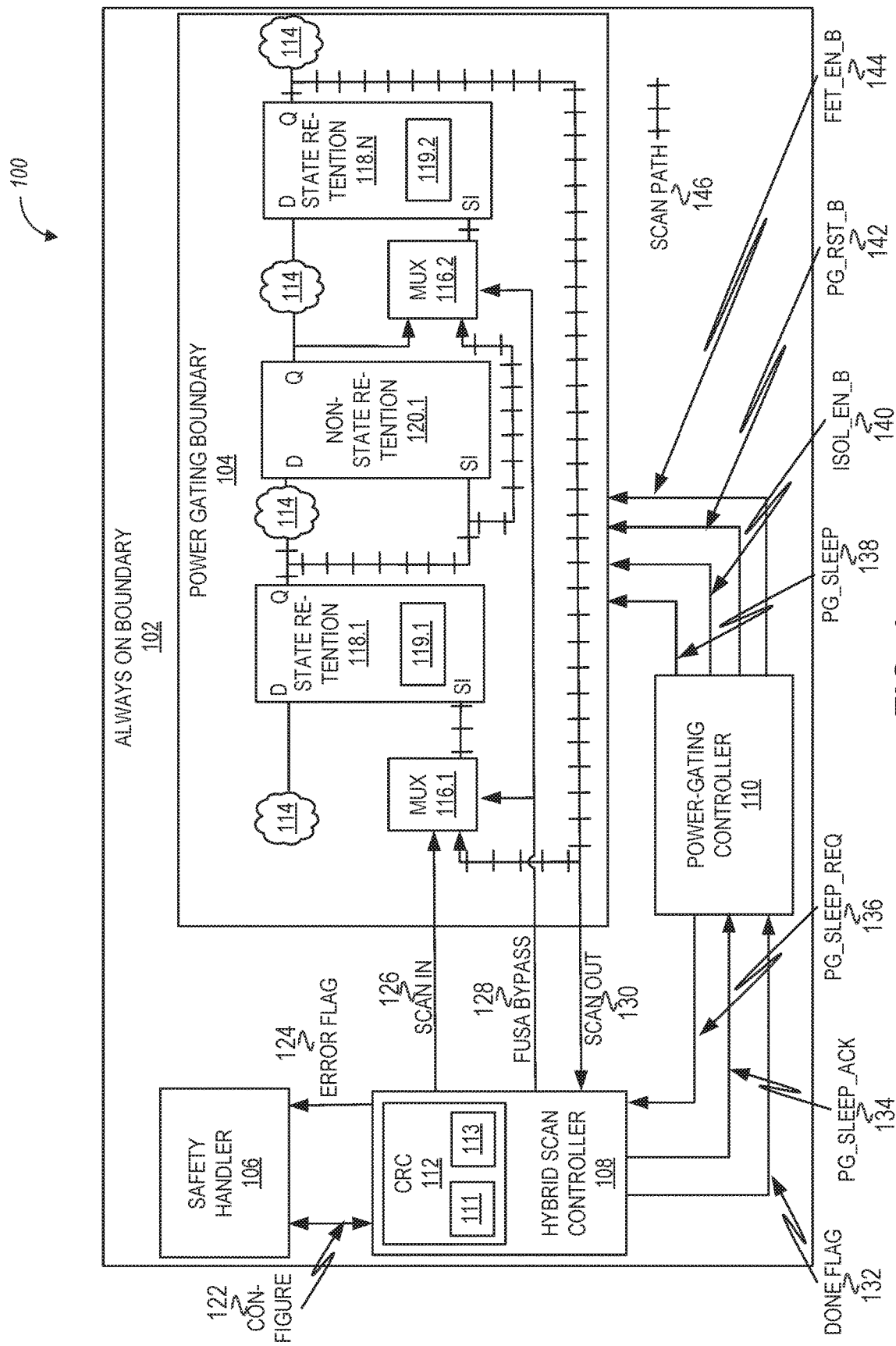
FIG. 1 illustrates a system for hardware-based local-state retention fault detection, in accordance with some embodiments.

FIG. 1 illustrates a system 100 for hardware-based local-state retention fault detection, in accordance with some embodiments. Illustrated in FIG. 1 is always-on boundary 102, power-gating (PG) boundary 104, safety handler 106, hybrid scan controller 108, power-gating controller 110, cyclic redundancy check (CRC) 112, other circuitry 114, multiplexer (MUX) 116, state retention 118, non-state retention 120.1, configure 122, error flag 124, scan in 126, functional safety (FUSA) bypass 128, scan out 130, done flag 132, PG sleep acknowledgement (ACK) 134, PG sleep request (REQ) 136, PG sleep 138, isolate (ISOL) enable (EN) B 140, PG reset B 142, PG field effect transistor (FET) EN B 144, and scan path 146.

Always-on boundary 102 is a portion of the system 100 where the power is always on or where the gating discussed in conjunction with power gating boundary 104 is not being performed.

Power gating boundary 104 includes MUX 116.1, other circuitry 114, state retention (SR) 118.1, non-state retention 120.1, MUX 116.2, and SR 118.2. Power gating boundary 104 is a portion of the system 100 where the power is gated. In some embodiments, power gating turns off the power to some modules (e.g., non-state retention 120.1) and saves (e.g., by maintaining at least some power) the state of other portions or modules (e.g., SR 118.1 and SR 118.2). Power gating reduces the power leakage in the silicon, in accordance with some embodiments.

In some embodiments, an auxiliary power supply (not illustrated) supplies power to the SR 118.1, 118.2 elements while another power supply is turned off or reduced for the non-state retention 120.1 portions. In some embodiments, the state retention 118.1, 118.2 elements retain the state of SR data 119. SR data 119 may be register values, latches values, finite state machines (FSMs) values, internal flag values, status values, logic enabling safety mechanisms values, etc. In some embodiments, SR data 119 is not accessible to software or firmware. In some embodiments, state retention 118.1, 118.2 elements and non-state retention 120 elements are memory elements.

Safety handler 106 is configured to send configuration 122 information to the hybrid scan controller 108. In some embodiments, configuration 122 includes a SR chain length. The SR chain length indicates a number of cyclic scan shifts the hybrid scan controller 108 needs to perform to shift each of the SR data 119.1, 119.2 in the scan path 146 to the CRC 112. For example, as illustrated, two cycles of a clock may be used to cycle the SR data 119.1, 119.2, to the hybrid scan controller 108 via scan out 130. Scan path 146 may be longer. For example, additional state retention 118 elements may be part of the scan path 146. For example, a new non-state retention 120 element (not illustrated) may be connected to state retention 118.2 element in a similar way as non-state retention 120.1 element is connected to state retention 118.1 element, and then another state retention 118 element could be connected to the new non-state retention 120 element in a similar way that state retention 120.2 element is connected to non-state retention 120 element. Similarly, an arbitrary chain of state retention 118 elements and non-state retention 120 elements may be joined together in the power gating boundary 104 to be part of the scan path 146. The safety handler 106 sends an indication of the length of this scan path 146 to the hybrid scan controller 108 as a SR chain length, in accordance with some embodiments.

The safety handler 106 is configured to receive an indication of an error with the error flag 124 signal. For example, if CRC 112 determines that the before CRC 111 and after CRC 113 do not match, then the hybrid controller 108 may raise the error flag 124. The safety handler 106 may raise additional signals (not illustrated) when it receives the error flag 124 to indicate to the system 100 that an error has occurred during power gating. Safety handler 106 is outside the power gating boundary 104 and remains active during sleep or power gating. In some embodiments, the hybrid scan controller 108 indicates there is an error in a different way, e.g., hybrid scan controller 108 may send a signal to the power-gating controller 110 or system 100.

In response to the power-gating controller 110 raising the PG_sleep_req 136 signal a first time, hybrid scan controller 108 is configured to shift the SR data 119 to the CRC 112. Hybrid scan controller 108 raises the PG_sleep_ack 134 signal when before CRC 111 is computed. In response to the power-gating controller 110 raising the PG_sleep_req 136 a second time, hybrid scan controller 108 is configured to shift the SR data 119 to the CRC 112. Hybrid scan controller 108 raises the done_flag 132 signal when after CRC 113 is computed and compared with before CRC 111. Hybrid scan controller 108 raises the error_flag 124 signal when the before CRC 111 does not match the after CRC 113. In some embodiments, hybrid scan controller 108 computes before CRC 111 and after CRC 113 based on receiving other signals, e.g., the system 100 may send a signal to the hybrid scan controller 108 that the system 100 intends to perform power gating (e.g., go into a sleep mode), and then another signal when the system 100 intends to exit the power gating mode (or the sleep portion of the power gating mode).

In some embodiments, hybrid scan controller 108 is configured to perform scan shifts as follows. Hybrid scan controller 108 raises the FUSA bypass 128 signal. The FUSA bypass 128 signal isolates the state retention 118.1, 118.2 elements from the non-state retention 120.1 elements. As disclosed herein there may be fewer or additional state retention 118 elements and/or non-state retention 120 elements. The FUSA bypass 128 signal communicates with MUXs 116.1, 116.2 to select the signals in the scan path 146, e.g., FUSA bypass 128 isolates the state retention 118 elements so they can be cycled to the CRC 112 via scan out 130. With each cycle (e.g., clock cycle) the SR value 119.2 of the last state retention 118.2 element in the scan path 146 is transferred to the hybrid scan controller 108 via scan out 130, and the previous SR value 119.1 (e.g., the SR value 119 of the previous state retention 118 element) is transferred to SR value 119.2 (with SR value 119.2 being transferred to SR value 119.1). The CRC 112 keeps a running CRC value (e.g., before CRC 111 or after CRC 113) that is updated with each cycle. Hybrid scan controller 108 is configured to perform scan shifts a number of times based on a value from safety handler 106 to allow values of each of the state retention 118.1, 118.2 to be output into scan out 130 and be part of the CRC value, e.g., either before CRC 111 or after CRC 113.

Hybrid scan controller 108 then drops the FUSA bypass 128 signal to return the state retention 118.1, 118.2 elements back into the original scan chain, e.g., so that the scan path 146 would include the non-state retention 120.1 elements. If before CRC 111 was calculated by the scan shifts, then hybrid scan controller 108 raises the PG_sleep_ack 134 signal. If after CRC 113 was calculated by the scan shifts, then hybrid scan controller 108 raises the done_flag 132. The error flag 124 may also be raised if the before CRC 111 does not match the after CRC 113. Scan path 146 indicates the path that is used to perform the scan shifts. In some embodiments, hybrid scan controller 108 may continue to isolate the state retention 118 elements (e.g., keep FUSA bypass 128=1) until after calculating after CRC 113. There may be more state retention 118.1, 118.2 elements and more non-state retention 120.1 elements. Hybrid scan controller 108 is outside the power gating boundary 104 and remains active during sleep or power gating.

In some embodiments, power-gating controller 110 is configured to autonomously perform power gating on the circuitry (e.g., modules) within the power gating boundary 104. Power-gating controller 110 is configured to raise the PG_sleep_req 136 signal to indicate to the hybrid scan controller 108 to determine before CRC 111. Power-gating controller 110 then waits for a PG_sleep_ack 134 signal to indicate that the before CRC 111 has been calculated. Power-gating controller 110 is configured to respond to a PG_rdy_req_b signal (not illustrated) going low by lowing the isol_en_b 140 signal to isolate the state retention 118 elements from the non-state retention 120 elements. Always on boundary 102 modules/circuitry, power gating boundary 104 modules/circuitry, and/or power-gating controller 110 may be configured to autonomously determine to power gate. Power-gating controller 110 is configured to raise PG_sleep 138 signal to enable retention of the state retention 118 elements and lower the power to the non-state retention 120 elements. After receiving PG_sleep_ack 134 signal, power-gating controller 110 is configured to raise PG_sleep 138 signal, lower PG_rst_b 142 signal (resets), lower FET_en_b 144 signal, and lower PG_rdy_ack_b signal (to acknowledge PG_rdy_req_b signal, not illustrated, from power gating boundary 104).

In response to PG_rdy_req_b signal being raised by the power gating boundary 104 (a request to un-power gate or repower the gates), power-gating controller 110 raises PG_rst_b 142 (resets), lower PG_sleep_req 136 (triggers scan to calculate after CRC 113), and lower PG_sleep 138 signal (indicates exiting of sleep state.)

In response to a raising of done_flag 132 signal by hybrid scan controller 108, power-gating controller 110 is configured to raise pg_sleep 138 signal (re-enables retention for state retention 118.1, 118.2 elements), lower PG_rst_b (re-asserts reset), raise PG_rst_b 142 signal, lower PG_sleep 138 signal (indicate not in sleep mode), raise isol_en_b 140 (does not isolate the state retention 118 elements from non-state retention 120 elements), and raise PG_rdy_ack_b signal (indicates that un-power gating is completed). Power-gating controller 110 is outside the power gating boundary 104 and remains active during sleep or power gating.

CRC 112 includes before CRC 111 and after CRC 113. CRC 112 is configured to determine a CRC value of the serially shifted data before (e.g., before CRC 111) and after (e.g., after CRC 113) power gating. CRC 112 is configured to compare the values of CRC 111 and CRC 113 and determine if a restoration error has occurred.

Other circuitry 114 is circuitry that may be connected to the state retention 118 and non-state retention 120. Other circuitry 114 may be modules, circuitry, elements, or other hardware.

MUXs 116.1, 116.2 are 2:1 MUXs in the scan path 146 that isolate the state retention 118 elements from the other elements, e.g., non-state retention 120 elements, when performing a cyclic scan, in accordance with some embodiments. In some embodiments, cyclic scan refers to the hybrid scan controller 108 selecting the sequence of state retention 118.1, 118.2 elements one at a time.

Figure 2A:
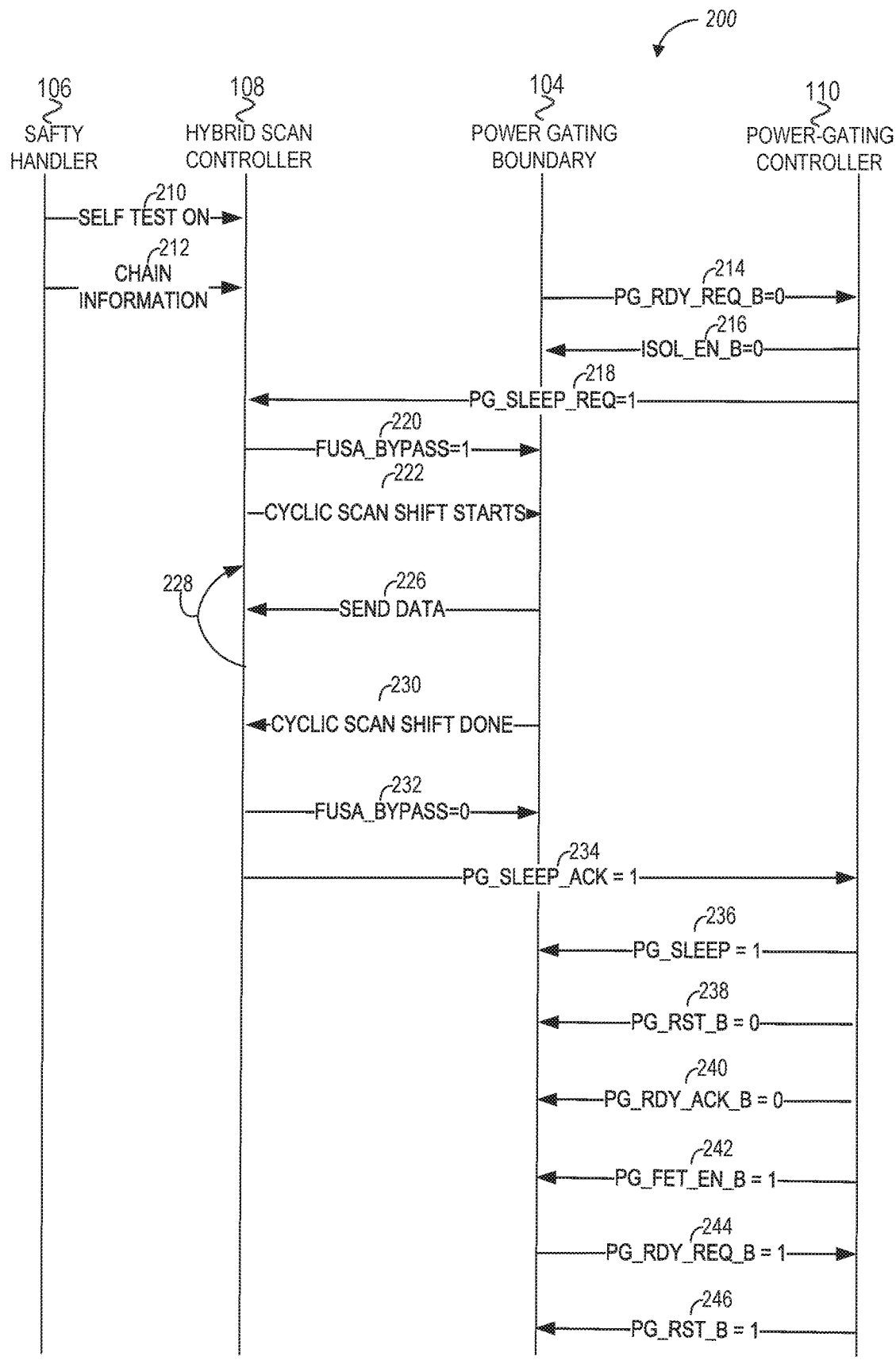
FIGS. 2A and 3B illustrate a method for hardware-based local state-retention fault detection, in accordance with some embodiments.
Figure 2B:
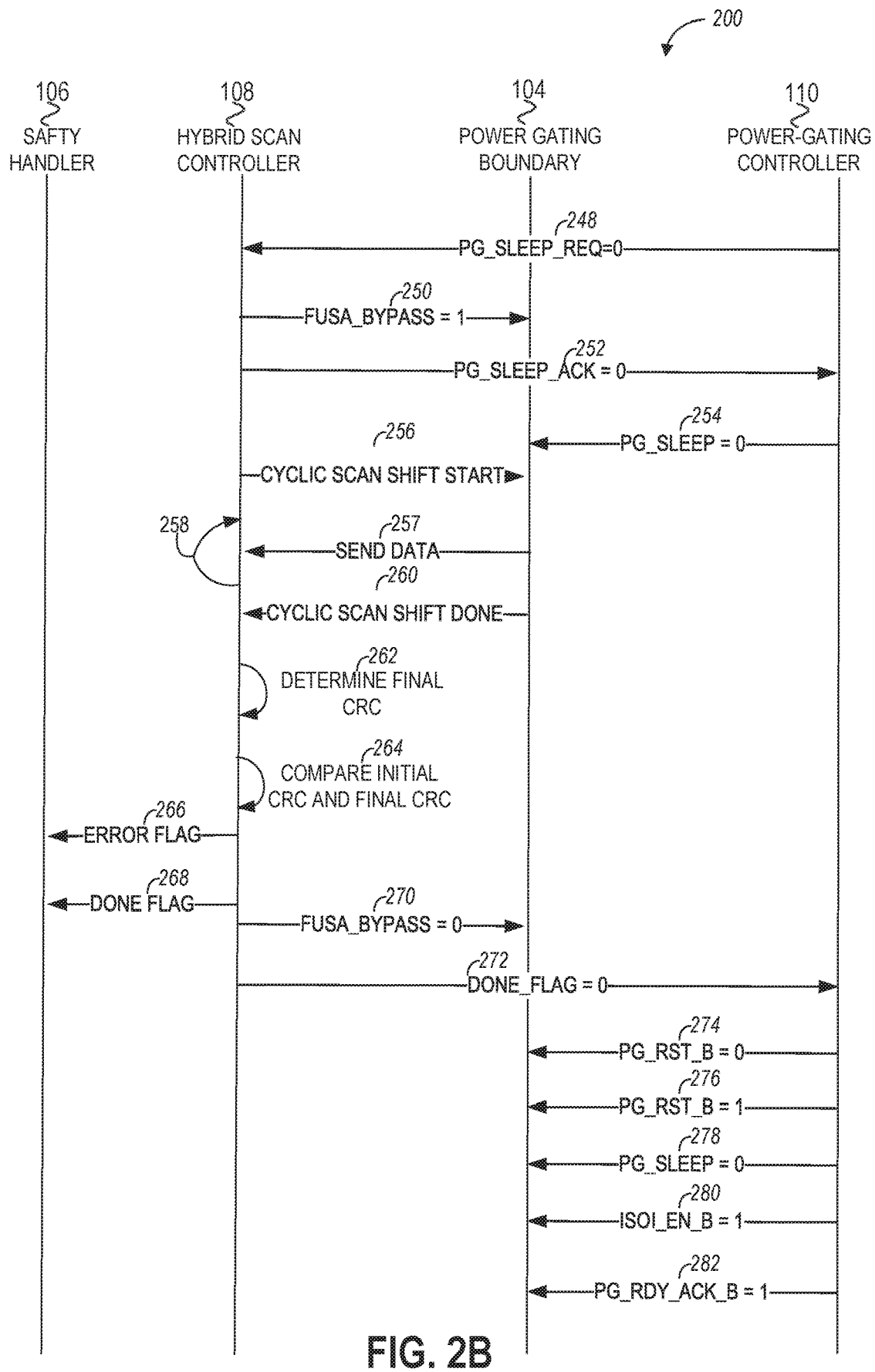

FIGS. 2A and 2B illustrate a method 200 for hardware-based local state-retention fault detection, in accordance with some embodiments, Illustrated in FIGS. 2A-B are safety handler 106, hybrid scan controller 108, power-gating boundary 104, and power-gating controller 110. Safety handler 106 is the same or similar as safety handler 160 as disclosed in conjunction with FIG. 1. Hybrid scan controller 108 is the same or similar as safety handler 160 as disclosed in conjunction with FIG. 1. Power-gating boundary 104 is the same or similar as safety handler 160 as disclosed in conjunction with FIG. 1. Power-gating controller 110 is the same or similar as safety handler 160 as disclosed in conjunction with FIG. 1.

Method 200 begins at operation 210 with safety handler 106 sending a self-test signal, which may be connected to hybrid scan controller 108. For example, safety handler 106 may indicate to hybrid scan controller 108 via a signal (e.g., setting a voltage to a value indicating 1 or on) that self-testing should be performed during power-gating. In some embodiments, the computation of the before CRC 111 and after CRC 113 is not performed when the self-testing on signal is not raised.

Method 200 continues at operation 212 with safety handler 106 sending chain information 212 to hybrid scan controller 108. For example, chain information 212 may be a number of state retention 118 elements within the power gating boundary 104 and/or may indicate a number of clock cycles need to cycle once through the scan path 146 (FIG. 1).

Method 200 continues at operation 214 with power-gating boundary 104 lowering PG_rdy_req_b signal to 0 to request power gating. The request may be made autonomously by power-gating boundary 104. The request may be based on a system 100 measuring power consumption being used by the power gating boundary 104 and determining to enter a sleep state or power-gating state based on the amount of measured power. Power-gating controller 110 determines PG_rdy_req_b signal is lowered to 0 and responds as described in operation 216. In some embodiments, PG_rdy_req_b signal may be set to 1 or another value to request power gating. And, in some embodiments, signal values illustrated in FIG. 1-3 are merely examples, and other signal values may be used.

Method 200 continues at operation 216 with power-gating controller 110 lowering isol_en_b signal to 0, which isolates the power-gating domain from the rest of the power gating boundary 104, e.g., isolates state retention 118.1, 118.2 elements from non-state retention 120.1. Operation 216 is in response to operation 214.

Method 200 continues at operation 218 with power-gating controller 110 raising pg_sleep_req signal to 1. The pg_sleep_req (e.g., pg_sleep_req 136) signal indicates that hybrid scan controller 108 should calculate before CRC 111. Operation 218 is in response to operation 214.

Method 200 continues at operation 220 with hybrid scan controller 108 raising FUSA_bypass signal to 1. Raising FUSA_bypass signal to 1 isolates the state retention 118 elements from the non-state retention 120 elements so that cyclic scan can be performed. As illustrated in FIG. 1, raising the FUSA bypass 128 signal to 1 selects the scan path 146 on the MUXs 116.

Method 200 continues at operation 222 with cyclic scan shift starts 222. For example, the scanning begins and continues with operations 226, 228.

Method 200 continues at operation 226 with sending data 226. For example, SR data 119.2 may be sent to hybrid controller 108 via scan out 130. CRC 112 may calculate before CRC 111 using SR data 119.2. Additionally, SR data 119.2 is transferred to SR data 119.1.

Method 200 continues at operation 228 with the cyclic shifting continuing. The method 200 may return to operation 226.

Method 200 continues at operation 226 with sending data 226. For example, SR data 119.2 (original SR data 119.1) may be sent to hybrid controller 108 via scan out 130. CRC 112 may calculate before CRC 111 using SR data 119.2 (original SR data 119.1). Additionally, SR data 119.2 is transferred to SR data 119.1. Since there are two state retention 118.1, 118.2 elements as illustrated in FIG. 1, two cyclic shifts is enough to calculate before CRC 111. The number of cyclic shifts is based on the length or number, N, of the state retention 118 elements.

Method 200 continues at operation cyclic scan shift done 230. For example, hybrid scan controller 108 may determine that the number of shifts is equal to the length that was sent to the hybrid scan controller 108 from the safety handler 106. Hybrid scan controller 108 may calculate the before CRC 111.

Method 200 continues at operation 232 with hybrid scan controller setting FUSA_bypass=0. Setting FUSA_bypass to 0 Returns the state retention 118 elements back into the original scan chain, e.g., the scan chain that includes scan path 146 has non-state retention 120.1 added back to the scan chain.

Method 200 continues at operation 234 with hybrid scan controller setting PG_sleep_ack to 1. Hybrid scan controller setting PG_sleep_ack (e.g., PG_sleep_ack 134) to 1 may indicate to the power-gating controller 110 that the before-CRC 111 has been calculated.

In accordance with some embodiments, method 200 continues optionally at operations 236, 238, 240, and 242 with power-gating controller 111 setting PG_sleep=1 (enables retention for state retention 118 elements), setting PG_rst_b (e.g., PG_rst_b 142)=0 (resets), setting PG_rst_b=1, and setting PG_fet_enb (e.g. fet_en_b 144)=1 (enable FET), respectively.

Method 200 continues at operation 244 with power-gating boundary 104 setting PG_rdy_req_b=1. Power-gating boundary 104 setting PG_rdy_req_b=1 indicates to power gating controller 110 to un-power gate, e.g., to determine if the SR data 119 was maintained properly.

Method 200 continues at operation 246 with power-gating controller 110 setting PG_rst_b=1. Power-gating controller 110 setting PG_rst_b (e.g., 142)=1 resets portions of the power gating boundary 104 circuitry.

Method 200 continues at operation 248 (FIG. 2B) with power-gating controller 110 setting PG_sleep_req=0. Power-gating controller 110 setting PG_sleep_req (e.g., PG_sleep_req 136)=0 indicates the power-gating controller 110 is requesting that hybrid scan controller 108 start a PG-exit cyclic scan sequence.

Method 200 continues at operation 250 with hybrid scan controller 108 setting FUSA_bypass=1 (e.g., FUSA bypass 128 to 1). Raising FUSA_bypass signal to 1 isolates the state retention 118 elements from the non-state retention 120 elements so that cyclic scan can be performed. As illustrated in FIG. 1, raising the FUSA bypass 128 signal to 1 selects the scan path 146 on the MUXs 116.

Method 200 continues at operation 252 with hybrid scan controller 108 setting pg_sleep_ack signal=0. Hybrid scan controller 108 setting pg_sleep_ack signal (e.g., pg_sleep_ack 134) to 0 indicates the PG-exit cyclic scan sequence will begin.

Method 200 continues at operation 254 with power-gating controller 110 setting pg_sleep=0. Power gating controller 110 setting pg_sleep signal (e.g., pg_sleep 138)=0 disables retention for state retention 118 elements. In some embodiments, setting pg_sleep signal=0 wakens the power gating boundary 104 circuitry that was in a sleep mode, e.g., non-state retention 120 elements. Waking the power gating boundary 104 circuitry may be performed before after-CRC 113 is determined to insure that the signals generated from waking the power gating boundary 104 circuitry does not affect the values of the SR data 119.

Method 200 continues at operation 256 with cyclic scan shift starts. For example, the scanning begins and continues with operations 257, 258. Method 200 continues at operation 257 with sending data. For example, SR data 119.2 may be sent to hybrid controller 108 via scan out 130. CRC 112 may calculate after CRC 113 using SR data 119.2. Additionally, SR data 119.2 is transferred to SR data 119.1. Method 200 continues at operation 258 with the cyclic shifting continuing. For example, method 200 returns to operation 257.

Method 200 continues at operation 257 with sending data. For example, SR data 119.2 (original SR data 119.1) may be sent to hybrid controller 108 via scan out 130. CRC 112 may calculate after CRC 113 using SR data 119.2 (original SR data 119.1). Additionally, SR data 119.2 is transferred to SR data 119.1. Since there are two state retention 118.1, 118.2 elements as illustrated in FIG. 1, two cyclic shifts are enough to calculate after CRC 113. Note that the cycles return the SR data 119 to their original state retention 118 elements when the cyclic scan is finished. The number of cyclic shifts is based on the length or number, N, of the state retention 118 elements.

Method 200 continues at operation 260 with cyclic scan shift done. For example, hybrid scan controller 108 may determine that the number of shifts is equal to the length that was sent to the hybrid scan controller 108 from the safety handler 106. Hybrid scan controller 108 may calculate the after CRC 113.

Method 200 continues at operation 262 with hybrid scan controller 108 determining final CRC. For example, hybrid scan controller 108 may determine final CRC 113, which may be determined in multiple steps each time SR data 119 is shifted into the hybrid scan controller 108.

Method 200 continues at operation 264 with comparing before CRC 111 and after CRC 113. For example, hybrid scan controller 108 may compare the before CRC 111 and the after CRC 113.

Method 200 continues at operation 266 with hybrid scan controller 108 setting the error flag 266. The hybrid scan controller 108 may set the error flag (e.g., error flag 124) to a value indicating an error (e.g., 0 or 1) if the before CRC 111 does not match the after CRC 113. The hybrid scan controller 108 may set the error flag to a value indicating no error if the before-CRC 111 matches the after-CRC 113. The safety handler 106 may receive the signals for the error flag 124. The safety handler 106 may perform resets or other functions in response to the error flag 124 indicating an error.

Method 200 continues at operation 268 with hybrid scan controller 108 setting a done flag. For example, hybrid scan controller 108 may set done flag (not illustrated) to indicate to safety handler 106 (or power-gating controller 110, system 100, or another component) that the PG-exit cyclic scan sequence requested by the power-gating controller 110 at operation 248 has been completed and that the value of the error flag 124 is valid.

Method 200 continues at operation 270 with FUSA_bypass=0. For example, hybrid scan controller 108 may set FUSA_bypass 128 to 0 to bring the non-state retention 120 elements back into the scan chain.

Method 200 continues at operation 272 with hybrid scan controller 108 setting the done flag. For example, hybrid scan controller 108 may set the done flag (e.g., done flag 132) to indicate to the power-gating controller 110 that the PG-exit cyclic scan sequence requested by the power-gating controller 110 at operation 248 has been completed.

Method 200 continues at operations 274, 276, 278, and 280 with power-gating controller 111 setting PG_rst_b (e.g., PG_rst_b 142)=0 (resets), setting PG_rst_b=1, PG_sleep=0 (e.g., PG_sleep 138=0) to indicate power gating is no longer active, and isol_en_b=1 (e.g., isol_en_b 140) to no longer isolate the state retention 118 elements, respectively.

Method 200 continues at operation 282 with power-gating controller 110 setting PG_rdy_ack_b=1. Power-gating boundary 104 setting PG_rdy_req_b=1 indicates to power gating boundary 104 that the power-gating is completed and that normal power is resumed, in accordance with some embodiments.

Figure 4:
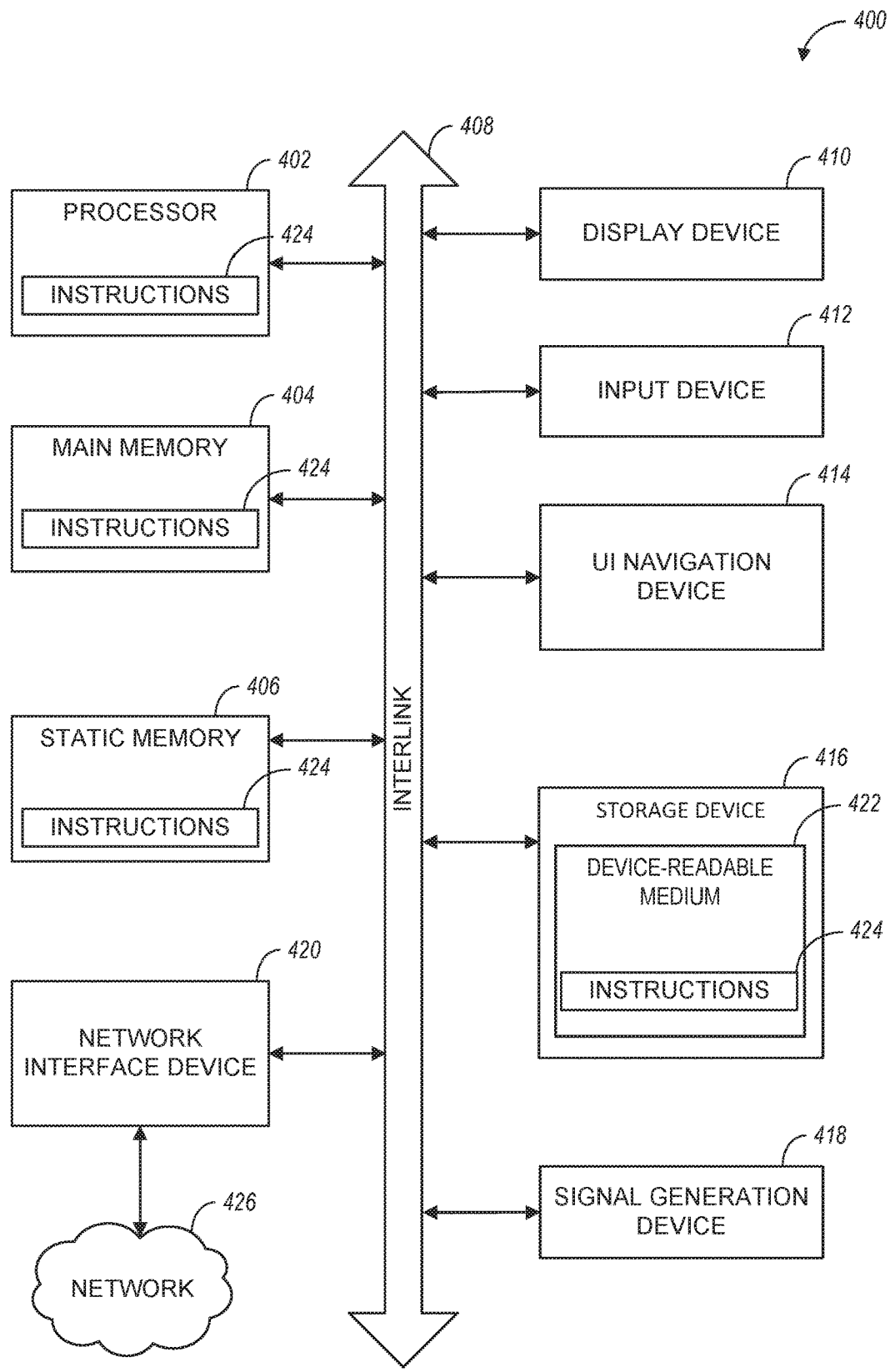
FIG. 4 is a block diagram illustrating an example machine upon which any one or more of the techniques (e.g., methodologies) discussed herein may perform, according to an embodiment.

One or more of the operations methods 200 may be performed by instructions 424 (FIG. 4). One or more of the operations of method 200 may be optional. Method 200 may include additional operations. Operations of method 200 may be performed in a different order, in accordance with some embodiments.

Figure 3A:
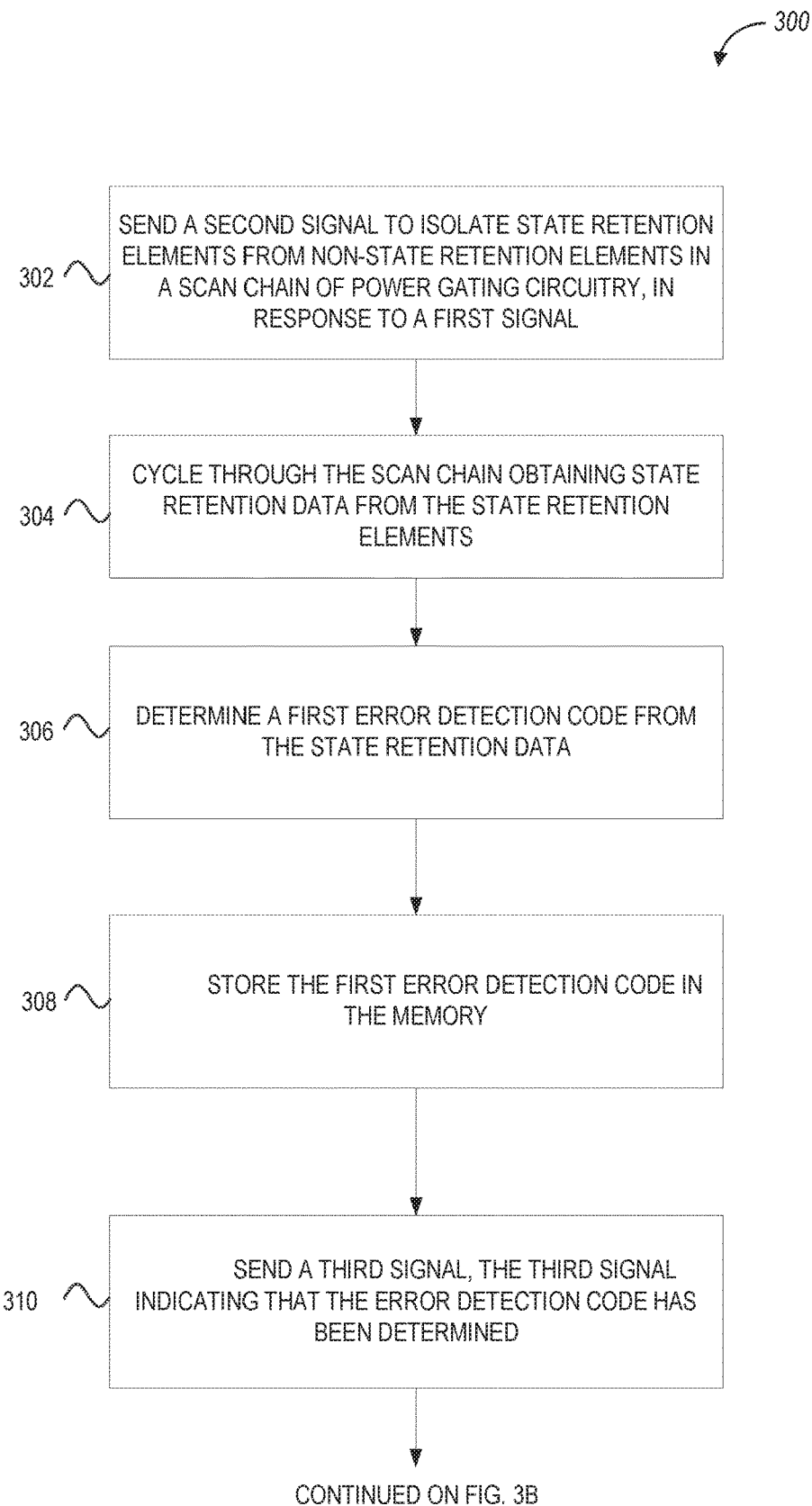
Figure 3B:
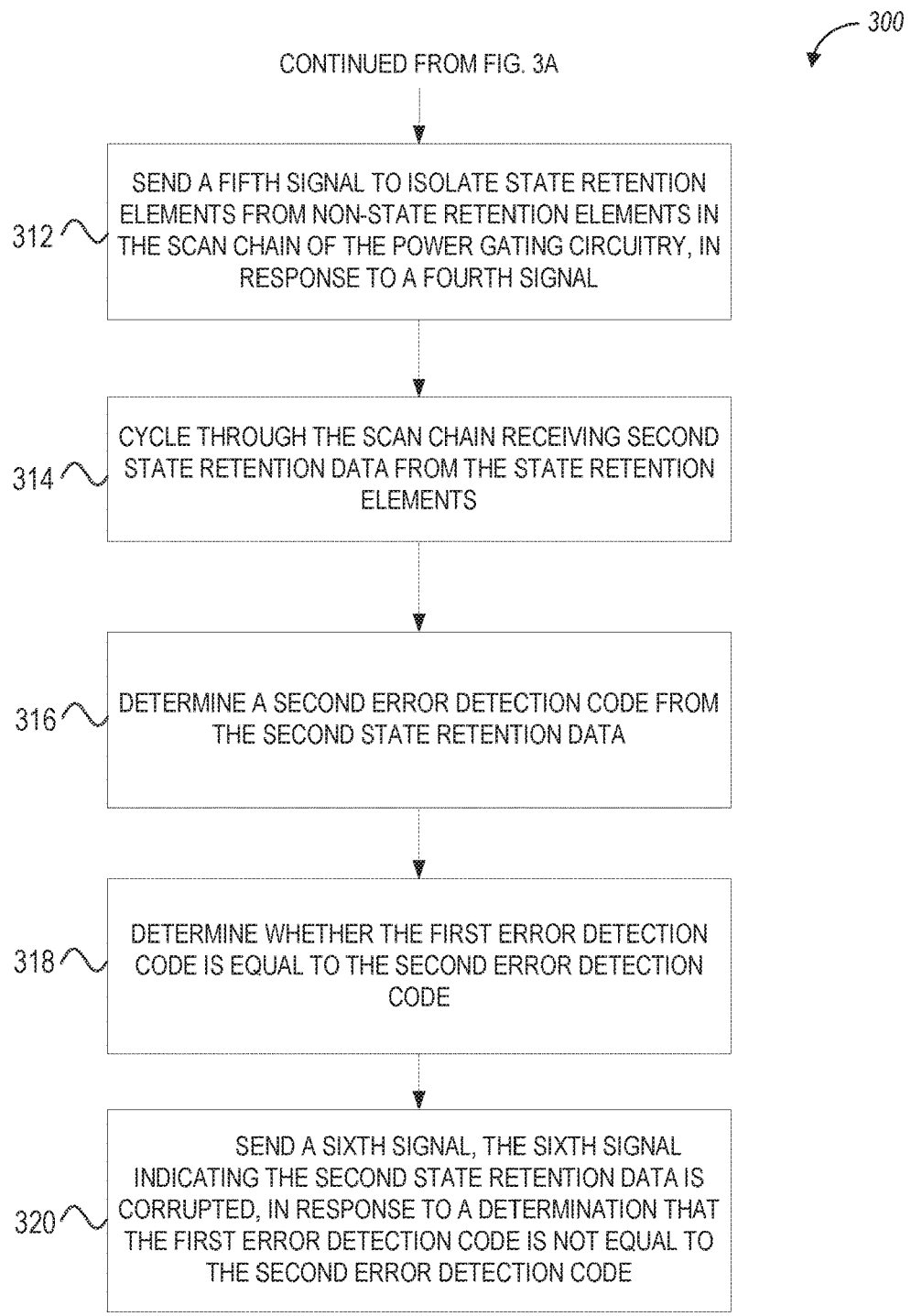

FIGS. 3A and 3B illustrate a method 300 for hardware-based local-state retention fault detection, in accordance with some embodiments. Method 300 begins at operation 302 with in response to a first signal, sending a second signal to isolate state retention elements from non-state retention elements in a scan chain of power gating circuitry. For example, referring to FIG. 2A, the hybrid scan controller 108 isolates the state retention 118 elements from the non-state retention 120 elements by sending FUSA_bypass=1 220 in response to power-gating controller 110 sending pg_sleep_req=1 to hybrid scan controller 108.

The method 300 continues at operation 304 with cycling through the scan chain obtaining state retention data from the state retention elements. For example, referring to FIG. 2A, hybrid scan controller 108 performs cycling through the scan chain in operations 222, 226, 228, and 230. For example, cyclic scan shift starts at operation 222 and cyclic scan shift is done at operation 230. The hybrid scan controller 108 isolates the state retention 118 elements from the non-state retention 120 elements, and then the SR data 119 is cycled into the hybrid scan controller 108 via scan out 130, e.g., one SR data 119 may be cycled into the hybrid scan controller 108 each clock (not illustrated) cycle.

The method 300 continues at operation 306 with determining a first error detection code from the state retention data. For example, hybrid scan controller 108 may update before CRC 111 each time SR data 119 is cycled into the hybrid scan controller 108 during operation 304.

The method 300 continues at operation 308 with storing the first error detection code in the memory. For example, hybrid scan controller 108 may store before CRC 111 in a memory of the hybrid scan controller 108, e.g., before CRC 111 may be a special purpose memory for storing, comparing, and/or computing before CRC 111 or a general random-access memory.

The method 300 continues at operation 310 with sending a third signal, the third signal indicating that the error detection code has been determined. For example, hybrid scan controller 108 may send PG_sleep_ack 134 to power-gating controller 110.

The method 300 continues at operation 312 with in response to a fourth signal, send a fifth signal to isolate state retention elements from non-state retention elements in the scan chain of the power gating circuitry. For example, referring to FIG. 2B, hybrid scan controller 108 sends FUSA_bypass=1 250 in response to power-gating controller 110 sending PG_sleep_req=0 at operation 248 to hybrid scan controller 108. For example, referring to FIG. 2B, the hybrid scan controller 108 isolates the state retention 118 elements from the non-state retention 120 elements by sending FUS-A_bypass=1 250 in response to power-gating controller 110 sending PG_sleep_req=1 to hybrid scan controller 108.

The method 300 continues at operation 314 with cycling through the scan chain receiving second state retention data from the state retention elements. For example, referring to FIG. 2B, hybrid scan controller 108 performs cycling through the scan chain in operations 256, 257, 258, and 260. For example, cyclic scan shift starts at operation 256 and cyclic scan shift is done at operation 260. The SR data 119 is cycled into the hybrid scan controller 108 via scan out 130, e.g., one SR data 119 may be cycled into the hybrid scan controller 108 each clock (not illustrated) cycle.

The method 300 continues at operation 316 with determining a second error detection code from the second state retention data. For example, hybrid scan controller 108 may update after CRC 113 each time SR data 119 is cycled into the hybrid scan controller 108 during operation 314. For example, referring to FIG. 2B, hybrid scan controller 108 may determine final CRC 113 at operation 262.

The method 300 continues at operation 318 with determining whether the first error detection code is equal to the second error detection code. For example, referring to FIG. 2B, hybrid scan controller 108 may compare before CRC 111 with final CRC 113 at operation 264.

The method 300 continues at operation 320 with in response to a determination that the first error detection code is not equal to the second error detection code, sending a sixth signal, the sixth signal indicating the second state retention data is corrupted. For example, hybrid scan controller 108 may send error flag 266 (operation 266 of method 200) if before CRC 111 and after CRC 113 do not match.

The method 300 may include sending a signal to rejoin the state retention elements and the non-state retention together in the scan chain. For example, hybrid scan controller 108 may send FUSA_bypass=0 at operation 232 and operation 270, referring to FIGS. 2 and 3, respectively.

One or more of the operations of method 300 may be optional. Method 300 may include additional operations. Operations of method 300 may be performed in a different order, in accordance with some embodiments. The methods 200 and 300 may be performed by an apparatus of a scan controller, in accordance with some embodiments.

One or more of the operations of the methods 200 and 300 may be performed by instructions 424. One or more of the operations of methods 200 and 300 may be performed using the instruction format or register architecture as disclosed in FIGS. 5A, 5B, 6A, 6B, 6C, 6D, and/or 7. For example, an apparatus of a scan controller (e.g., hybrid scan controller 108), safety handler (e.g., safety handler 106), or power-gating controller (e.g., power-gating controller 110) may use the instruction formats or register architecture as disclosed in FIGS. 5A, 5B, 6A, 6B, 6C, 6D, and/or 7. The state retention 118 elements, non-state retention 120, MUXs 116, and/or other circuitry 114 may use the instruction format or register architecture as disclosed in FIGS. 5A, 5B, 6A, 6B, 6C, 6D, and/or 7. The state retention 118 elements may maintain the state of the instruction format or register architecture as disclosed in FIGS. 5A, 5B, 6A, 6B, 6C, 6D, and/or 7. The scan controller (e.g., hybrid scan controller 108), safety handler (e.g., safety handler 106), power-gating controller (e.g., power-gating controller 110), state retention 118 elements, non-state retention 120, MUXs 116, and/or other circuitry 114 may include processor pipeline 800 (FIG.

8A) and/or processor core 890 (FIG. 8B). The state retention 118 elements may maintain the state of the processor pipeline 800 and/or processor core 890.

The scan controller (e.g., hybrid scan controller 108), safety handler (e.g., safety handler 106), power-gating controller (e.g., power-gating controller 110), state retention 118 elements, non-state retention 120, MUXs 116, and/or other circuitry 114 may include one or more elements of the core architecture disclosed in FIGS. 9A and 9B. For example, the CRC 112 (FIG. 1) may be stored in a cache 906, 904, 906A. The scan controller (e.g., hybrid scan controller 108), safety handler (e.g., safety handler 106), power-gating controller (e.g., power-gating controller 110), state retention 118 elements, non-state retention 120, MUXs 116, and/or other circuitry 114 may include or be included in one or more elements of the processor 1000 as disclosed in FIG. 10. For example, the CRC 112 (FIG. 1) may be stored in a cache 906, 904, 906A. In another example, state retention 118 elements may maintain the state of the processor 1000. Portions of processor 1000 may be power-gated. The scan controller (e.g., hybrid scan controller 108), safety handler (e.g., safety handler 106), power-gating controller (e.g., power-gating controller 110) may be part of the special purpose logic 1008 or processor 1000 and/or connected to the processor 1000.

The scan controller (e.g., hybrid scan controller 108), safety handler (e.g., safety handler 106), power-gating controller (e.g., power-gating controller 110), state retention 118 elements, non-state retention 120, MUXs 116, and/or other circuitry 114 may include or be included in one or more elements of the computer architectures of FIGS. 11-14. For example, the hybrid scan controller 108 may be in communication with one or more elements of computer architectures that use power gating and the MUXs 116 and state retention 118 elements may be included in one or more elements of the computer architectures. For example, referring to FIG. 14, application processor 1410 may include MUXs 116 and state retention 118 elements and the hybrid scan controller 108 may be in communication with the application processor 1410 via the interconnect unit 1402. The scan controller (e.g., hybrid scan controller 108), safety handler (e.g., safety handler 106), power-gating controller (e.g., power-gating controller 110), state retention 118 elements, non-state retention 120, MUXs 116, and/or other circuitry 114 may include or be included in one or more elements of the computer architectures of FIG. 15. For example, referring to FIG. 15, processor without an X86 instruction set core 1514 may include MUXs 116 and state retention 118 elements and the hybrid scan controller 108 may be in communication with the processor without an X86 instruction set core 1514. The processor without an X86 instruction set core 1514 may use power gating, in accordance with some embodiments.

A processor subsystem may be used to execute the operations on a machine-readable medium. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Examples, as described herein, may include, or may operate on, logic or a number of components, modules, or mechanisms. Modules may be hardware, software, or firmware communicatively coupled to one or more processors in order to carry out the operations described herein. Modules may be hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Circuitry or circuits, as used in this document, may comprise, for example, singly or in any combination, hardwired circuitry, programmable circuitry such as computer processors comprising one or more individual instruction processing cores, state machine circuitry, and/or firmware that stores instructions executed by programmable circuitry. The circuits, circuitry, or modules may, collectively or individually, be embodied as circuitry that forms part of a larger system, for example, an integrated circuit (IC), system on-chip (SoC), desktop computers, laptop computers, tablet computers, servers, smart phones, etc.

As used in any embodiment herein, the term "logic" may refer to firmware and/or circuitry configured to perform any of the aforementioned operations. Firmware may be embodied as code, instructions or instruction sets and/or data that are hard-coded (e.g., nonvolatile) in memory devices and/or circuitry.

"Circuitry," as used in any embodiment herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processor circuitry executing code and/or instructions sets (e.g., software, firmware, etc.) corresponding to the functionality described herein, thus transforming a general-purpose processor into a specific-purpose processing environment to perform one or more of the operations described herein. In some embodiments, the processor circuitry may be embodied as a stand-alone integrated circuit or may be incorporated as one of several components on an integrated circuit. In some embodiments, the various components and circuitry of the node or other systems may be combined in a system-on-a-chip (SoC) architecture.

FIG. 4 is a block diagram illustrating a machine in the example form of a computer system 400, within which a set or sequence of instructions may be executed to cause the machine to perform any one of the methodologies discussed herein, according to an embodiment. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be a head-mounted display, wearable device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example computer system 400 includes at least one processor 402 (e.g., a central processing unit (CPU), a graphics processing unit (GPU) or both, processor cores, compute nodes, etc.), a main memory 404 and a static memory 406, which communicate with each other via a link 408 (e.g., bus). The computer system 400 may further include a video display unit 410, an alphanumeric input device 412 (e.g., a keyboard), and a user interface (UI) navigation device 414 (e.g., a mouse). In one embodiment, the video display unit 410, input device 412 and UI navigation device 414 are incorporated into a touch screen display. The computer system 400 may additionally include a storage device 416 (e.g., a drive unit), a signal generation device 418 (e.g., a speaker), a network interface device 420, and one or more sensors (not shown), such as a global positioning system (GPS) sensor, compass, accelerometer, gyrometer, magnetometer, or other sensor.

The storage device 416 includes a machine-readable medium 422 on which is stored one or more sets of data structures and instructions 424 (e.g., software) embodying or utilized by any one or more of the methodologies or functions described herein. The instructions 424 may also reside, completely or at least partially, within the main memory 404, static memory 406, and/or within the processor 402 during execution thereof by the computer system 400, with the main memory 404, static memory 406, and the processor 402 also constituting machine-readable media.

While the machine-readable medium 422 is illustrated in an example embodiment to be a single medium, the term "machine-readable medium" may include a single medium or multiple media (e.g., a centralized or distributed database, and/or associated caches and servers) that store the one or more instructions 424. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 424 may further be transmitted or received over a communications network 426 using a transmission medium via the network interface device 420 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Bluetooth, Wi-Fi, 3G, and 4G LTE/LTE-A, 5G, DSRC, or WiMAX networks). The term "transmission medium" shall be taken to include any intangible medium that is capable of storing, encoding, or carrying instructions for execution by the machine, and includes digital or analog communications signals or other intangible medium to facilitate communication of such software.

The figures below detail architectures and systems to implement embodiments of the above. In some embodiments, one or more hardware components and/or instructions described above are emulated as detailed below, or implemented as software modules.

Embodiments of the instruction(s) detailed above are embodied may be embodied in a "generic vector friendly instruction format" which is detailed below. In other embodiments, such a format is not utilized and another instruction format is used, however, the description below of the writemask registers, various data transformations (swizzle, broadcast, etc.), addressing, etc. is generally applicable to the description of the embodiments of the instruction(s) above. Additionally, systems, architectures, and pipelines are detailed below. Embodiments of the instruction(s) above may be executed on such systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Instruction Formats

Embodiments of the instruction(s) described herein may be embodied in different formats. Additionally, systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 5B:
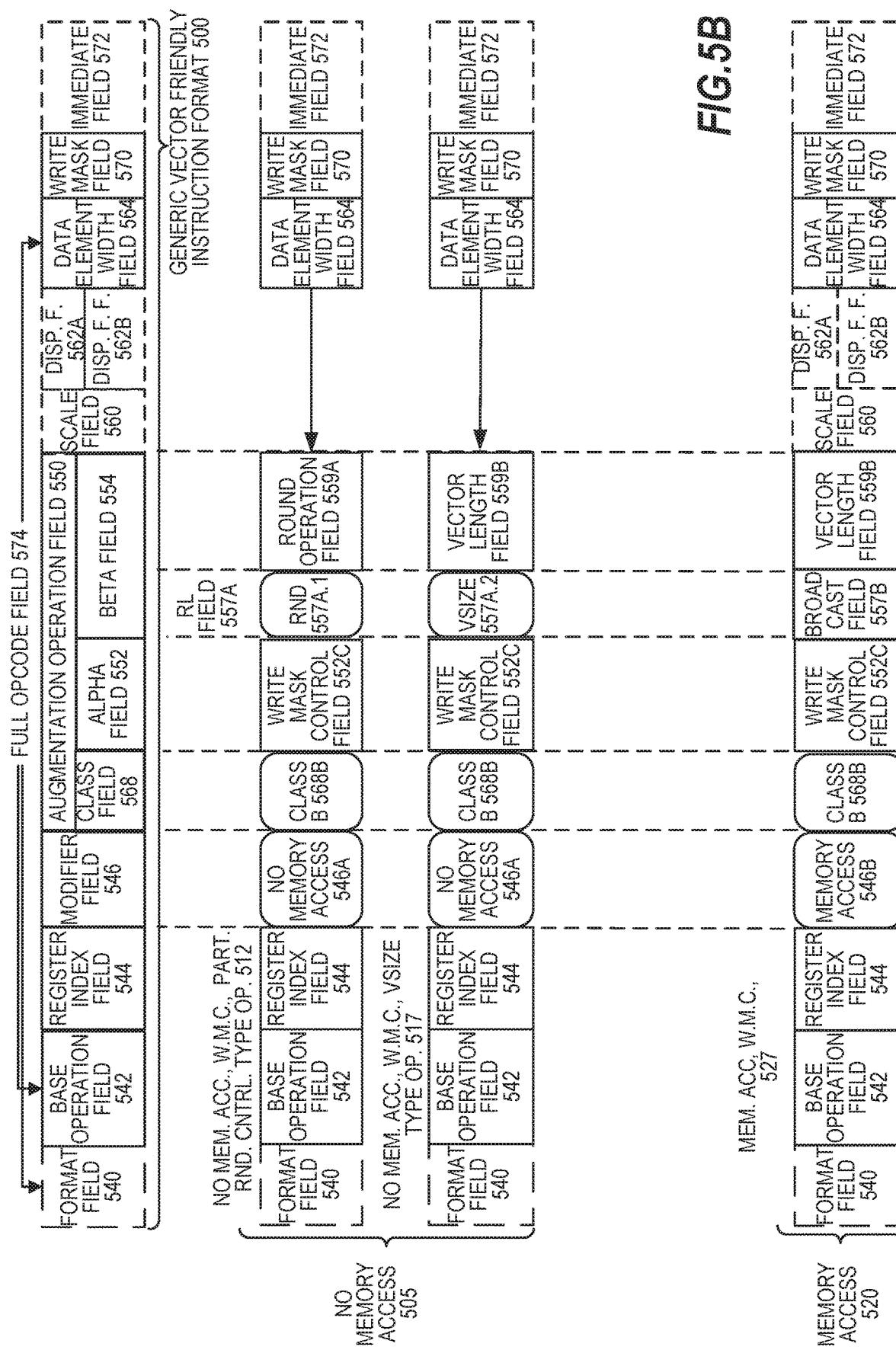

FIGS. 5A-5B are block diagrams illustrating a generic vector friendly instruction format and instruction templates thereof according to an embodiment. FIG. 5A is a block diagram illustrating a generic vector friendly instruction format and class A instruction templates thereof according to an embodiment; while FIG. 5B is a block diagram illustrating the generic vector friendly instruction format and class B instruction templates thereof according to an embodiment. Specifically, a generic vector friendly instruction format 500 for which are defined class A and class B instruction templates, both of which include no memory access 505 instruction templates and memory access 520 instruction templates. The term generic in the context of the vector friendly instruction format refers to the instruction format not being tied to any specific instruction set.

While embodiments will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 5A include: 1) within the no memory access 505 instruction templates there is shown a no memory access, full round control type operation 510 instruction template and a no memory access, data transform type operation 515 instruction template; and 2) within the memory access 520 instruction templates there is shown a memory access, temporal 525 instruction template and a memory access, non-temporal 530 instruction template. The class B instruction templates in FIG. 5B include: 1) within the no memory access 505 instruction templates there is shown a no memory access, write mask control, partial round control type operation 512 instruction template and a no memory access, write mask control, vsize type operation 517 instruction template; and 2) within the memory access 520 instruction templates there is shown a memory access, write mask control 527 instruction template.

The generic vector friendly instruction format 500 includes the following fields listed below in the order illustrated in FIGS. 5A-5B.

Format field 540—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 542—its content distinguishes different base operations.

Register index field 544—its content, directly or through address generation, specifies the locations of the source and destination operands, be they in registers or in memory. These include a sufficient number of bits to select N registers from a P×Q (e.g., 32×512, 16×128, 32×1024, 64×1024) register file. While in an embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 546—its content distinguishes occurrences of instructions in the generic vector instruction format that specify memory access from those that do not; that is, between no memory access 505 instruction templates and memory access 520 instruction templates. Memory access operations read and/or write to the memory hierarchy (in some cases specifying the source and/or destination addresses using values in registers), while non-memory access operations do not (e.g., the source and destinations are registers). While in an embodiment this field also selects between three different ways to perform memory address calculations, alternative embodiments may support more, less, or different ways to perform memory address calculations.

Augmentation operation field 550—its content distinguishes which one of a variety of different operations to be performed in addition to the base operation. This field is context specific. In an embodiment, this field is divided into a class field 568, an alpha field 552, and a beta field 554. The augmentation operation field 550 allows common groups of operations to be performed in a single instruction rather than 2, 3, or 4 instructions.

Scale field 560—its content allows for the scaling of the index field's content for memory address generation (e.g., for address generation that uses 2scale*index+base).

Displacement Field 562A—its content is used as part of memory address generation (e.g., for address generation that uses 2scale*index+base+displacement).

Displacement Factor Field 562B (note that the juxtaposition of displacement field 562A directly over displacement factor field 562B indicates one or the other is used)—its content is used as part of address generation; it specifies a displacement factor that is to be scaled by the size of a memory access (N)—where N is the number of bytes in the memory access (e.g., for address generation that uses 2scale*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 574 (described later herein) and the data manipulation field 554C. The displacement field 562A and the displacement factor field 562B are optional in the sense that they are not used for the no memory access 505 instruction templates and/or different embodiments may implement only one or none of the two.

Data element width field 564—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 570—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in another embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in an embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 570 allows for partial vector operations, including loads, stores, arithmetic, logical, etc. While embodiments are described in which the write mask field's 570 content selects one of a number of write mask registers that contains the write mask to be used (and thus the write mask field's 570 content indirectly identifies that masking to be performed), alternative embodiments instead or additional allow the mask write field's 570 content to directly specify the masking to be performed.

Immediate field 572—its content allows for the specification of an immediate. This field is optional in the sense that is it not present in an implementation of the generic vector friendly format that does not support immediate and it is not present in instructions that do not use an immediate.

Class field 568—its content distinguishes between different classes of instructions. With reference to FIGS. 5A-5B, the contents of this field select between class A and class B instructions. In FIGS. 5A-5B, rounded corner squares are used to indicate a specific value is present in a field (e.g., class A 568A and class B 568B for the class field 568 respectively in FIGS. 5A-5B).

Instruction Templates of Class A

In the case of the non-memory access 505 instruction templates of class A, the alpha field 552 is interpreted as an RS field 552A, whose content distinguishes which one of the different augmentation operation types are to be performed (e.g., round 552A.1 and data transform 552A.2 are respectively specified for the no memory access, round type operation 510 and the no memory access, data transform type operation 515 instruction templates), while the beta field 554 distinguishes which of the operations of the specified type is to be performed. In the no memory access 505 instruction templates, the scale field 560, the displacement field 562A, and the displacement scale filed 562B are not present.

No-Memory Access Instruction Templates—Full Round Control Type Operation

In the no memory access full round control type operation 510 instruction template, the beta field 554 is interpreted as a round control field 554A, whose content(s) provide static rounding. While in the described embodiments the round control field 554A includes a suppress all floating point exceptions (SAE) field 556 and a round operation control field 558, alternative embodiments may support may encode both these concepts into the same field or only have one or the other of these concepts/fields (e.g., may have only the round operation control field 558).

SAE field 556—its content distinguishes whether or not to disable the exception event reporting; when the SAE field's 556 content indicates suppression is enabled, a given instruction does not report any kind of floating-point exception flag and does not raise any floating point exception handler.

Round operation control field 558—its content distinguishes which one of a group of rounding operations to perform (e.g., Round-up, Round-down, Round-towards-zero and Round-to-nearest). Thus, the round operation control field 558 allows for the changing of the rounding mode on a per instruction basis. In an embodiment where a processor includes a control register for specifying rounding modes, the round operation control field's 550 content overrides that register value.

No Memory Access Instruction Templates—Data Transform Type Operation

In the no memory access data transform type operation 515 instruction template, the beta field 554 is interpreted as a data transform field 554B, whose content distinguishes which one of a number of data transforms is to be performed (e.g., no data transform, swizzle, broadcast).

In the case of a memory access 520 instruction template of class A, the alpha field 552 is interpreted as an eviction hint field 552B, whose content distinguishes which one of the eviction hints is to be used (in FIG. 5A, temporal 552B.1 and non-temporal 552B.2 are respectively specified for the memory access, temporal 525 instruction template and the memory access, non-temporal 530 instruction template), while the beta field 554 is interpreted as a data manipulation field 554C, whose content distinguishes which one of a number of data manipulation operations (also known as primitives) is to be performed (e.g., no manipulation; broadcast; up conversion of a source; and down conversion of a destination). The memory access 520 instruction templates include the scale field 560, and optionally the displacement field 562A or the displacement scale field 562B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 552 is interpreted as a write mask control (Z) field 552C, whose content distinguishes whether the write masking controlled by the write mask field 570 should be a merging or a zeroing.

In the case of the non-memory access 505 instruction templates of class B, part of the beta field 554 is interpreted as an RL field 557A, whose content distinguishes which one of the different augmentation operation types are to be performed (e.g., round 557A.1 and vector length (VSIZE) 557A.2 are respectively specified for the no memory access, write mask control, partial round control type operation 512 instruction template and the no memory access, write mask control, VSIZE type operation 517 instruction template), while the rest of the beta field 554 distinguishes which of the operations of the specified type is to be performed. In the no memory access 505 instruction templates, the scale field 560, the displacement field 562A, and the displacement scale filed 562B are not present.

In the no memory access, write mask control, partial round control type operation 510 instruction template, the rest of the beta field 554 is interpreted as a round operation field 559A and exception event reporting is disabled (a given instruction does not report any kind of floating-point exception flag and does not raise any floating point exception handler).

Round operation control field 559A—just as round operation control field 558, its content distinguishes which one of a group of rounding operations to perform (e.g., Round-up, Round-down, Round-towards-zero and Round-to-nearest). Thus, the round operation control field 559A allows for the changing of the rounding mode on a per instruction basis. In an embodiment where a processor includes a control register for specifying rounding modes, the round operation control field's 550 content overrides that register value.

In the no memory access, write mask control, VSIZE type operation 517 instruction template, the rest of the beta field 554 is interpreted as a vector length field 559B, whose content distinguishes which one of a number of data vector lengths is to be performed on (e.g., 128, 256, or 512 byte).

In the case of a memory access 520 instruction template of class B, part of the beta field 554 is interpreted as a broadcast field 557B, whose content distinguishes whether or not the broadcast type data manipulation operation is to be performed, while the rest of the beta field 554 is interpreted the vector length field 559B. The memory access 520 instruction templates include the scale field 560, and optionally the displacement field 562A or the displacement scale field 562B.

With regard to the generic vector friendly instruction format 500, a full opcode field 574 is shown including the format field 540, the base operation field 542, and the data element width field 564. While one embodiment is shown where the full opcode field 574 includes all of these fields, the full opcode field 574 includes less than all of these fields in embodiments that do not support all of them. The full opcode field 574 provides the operation code (opcode).

The augmentation operation field 550, the data element width field 564, and the write mask field 570 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Specific Vector Friendly Instruction Format

FIG. 6 is a block diagram illustrating a specific vector friendly instruction format according to an embodiment. FIG. 6 shows a specific vector friendly instruction format 600 that is specific in the sense that it specifies the location, size, interpretation, and order of the fields, as well as values for some of those fields. The specific vector friendly instruction format 600 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 5 into which the fields from FIG. 6 map are illustrated.

It should be understood that, although embodiments are described with reference to the specific vector friendly instruction format 600 in the context of the generic vector friendly instruction format 500 for illustrative purposes, the invention is not limited to the specific vector friendly instruction format 600 except where claimed. For example, the generic vector friendly instruction format 500 contemplates a variety of possible sizes for the various fields, while the specific vector friendly instruction format 600 is shown as having fields of specific sizes. By way of specific example, while the data element width field 564 is illustrated as a one bit field in the specific vector friendly instruction format 600, the invention is not so limited (that is, the generic vector friendly instruction format 500 contemplates other sizes of the data element width field 564).

The generic vector friendly instruction format 500 includes the following fields listed below in the order illustrated in FIG. 6A.

EVEX Prefix (Bytes 0-3) 602—is encoded in a four-byte form.

Format Field 540 (EVEX Byte 0, bits [7:0])—the first byte (EVEX Byte 0) is the format field 540 and it contains 0x62 (the unique value used for distinguishing the vector friendly instruction format in an embodiment).

The second-fourth bytes (EVEX Bytes 1-3) include a number of bit fields providing specific capability.

REX field 605 (EVEX Byte 1, bits [7-5])—consists of an EVEX.R bit field (EVEX Byte 1, bit [7]-R), EVEX.X bit field (EVEX byte 1, bit [6]—X), and 557BEX byte 1, bit [5]—B). The EVEX.R, EVEX.X, and EVEX.B bit fields provide the same functionality as the corresponding VEX bit fields, and are encoded using Is complement form, i.e. ZMMO is encoded as 1111B, ZMM15 is encoded as 00000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 510—this is the first part of the REX' field 510 and is the EVEX.R' bit field (EVEX Byte 1, bit [4]-R') that is used to encode either the upper 16 or lower 16 of the extended 32 register set. In an embodiment, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 615 (EVEX byte 1, bits [3:0]-mmmm)—its content encodes an implied leading opcode byte (0F, 0F 38, or 0F 3).

Data element width field 564 (EVEX byte 2, bit [7]-W)—is represented by the notation EVEX.W. EVEX.W is used to define the granularity (size) of the datatype (either 32-bit data elements or 64-bit data elements).

EVEX.vvvv 620 (EVEX Byte 2, bits [6:3]-vvvv)—the role of EVEX.vvvv may include the following: 1) EVEX.vvvv encodes the first source register operand, specified in inverted (Is complement) form and is valid for instructions with 2 or more source operands; 2) EVEX.vvvv encodes the destination register operand, specified in is complement form for certain vector shifts; or 3) EVEX.vvvv does not encode any operand, the field is reserved and should contain 1111b. Thus, EVEX.vvvv field 620 encodes the 4 low-order bits of the first source register specifier stored in inverted (is complement) form. Depending on the instruction, an extra different EVEX bit field is used to extend the specifier size to 32 registers.

EVEX.U 568 Class field (EVEX byte 2, bit [2]-U)—If EVEX.U=0, it indicates class A or EVEX.U0; if EVEX.U=1, it indicates class B or EVEX.U1.

Prefix encoding field 625 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In an embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 552 (EVEX byte 3, bit [7]-EH; also known as EVEX.EH, EVEX.rs, EVEX.RL, EVEX.write mask control, and EVEX.N; also illustrated with a)—as previously described, this field is context specific.

Beta field 554 (EVEX byte 3, bits [6:4]-SSS, also known as EVEX.s2-0, EVEX.r2-0, EVEX.rr1, EVEX.LL0, EVEX.LLB; also illustrated with βββ)—as previously described, this field is context specific.

REX' field 510—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 570 (EVEX byte 3, bits [2:0]-kkk)—its content specifies the index of a register in the write mask registers as previously described. In an embodiment, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 630 (Byte 4) is also known as the opcode byte. Part of the opcode is specified in this field.

MOD R/M Field 640 (Byte 5) includes MOD field 642, Reg field 644, and R/M field 646. As previously described, the MOD field's 642 content distinguishes between memory access and non-memory access operations. The role of Reg field 644 can be summarized to two situations: encoding either the destination register operand or a source register operand, or be treated as an opcode extension and not used to encode any instruction operand. The role of R/M field 646 may include the following: encoding the instruction operand that references a memory address, or encoding either the destination register operand or a source register operand.

Scale, Index, Base (SIB) Byte (Byte 6)—As previously described, the scale field's 550 content is used for memory address generation. SIB.xxx 654 and SIB.bbb 656—the contents of these fields have been previously referred to with regard to the register indexes Xxxx and Bbbb.

Displacement field 562A (Bytes 7-10)—when MOD field 642 contains 10, bytes 7-10 are the displacement field 562A, and it works the same as the legacy 32-bit displacement (disp32) and works at byte granularity.

Displacement factor field 562B (Byte 7)—when MOD field 642 contains 01, byte 7 is the displacement factor field 562B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 562B is a reinterpretation of disp8; when using displacement factor field 562B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 562B substitutes the legacy x86 instruction set 8-bit displacement. Thus, the displacement factor field 562B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 572 operates as previously described.

Full Opcode Field

FIG. 6B is a block diagram illustrating the fields of the specific vector friendly instruction format 600 that make up the full opcode field 574 according to an embodiment. Specifically, the full opcode field 574 includes the format field 540, the base operation field 542, and the data element width (W) field 564. The base operation field 542 includes the prefix encoding field 625, the opcode map field 615, and the real opcode field 630.

Register Index Field

FIG. 6C is a block diagram illustrating the fields of the specific vector friendly instruction format 600 that make up the register index field 544 according to an embodiment. Specifically, the register index field 544 includes the REX field 605, the REX' field 610, the MODR/M.reg field 644, the MODR/M.r/m field 646, the VVVV field 620, xxx field 654, and the bbb field 656.

Augmentation Operation Field

Figure 6D:
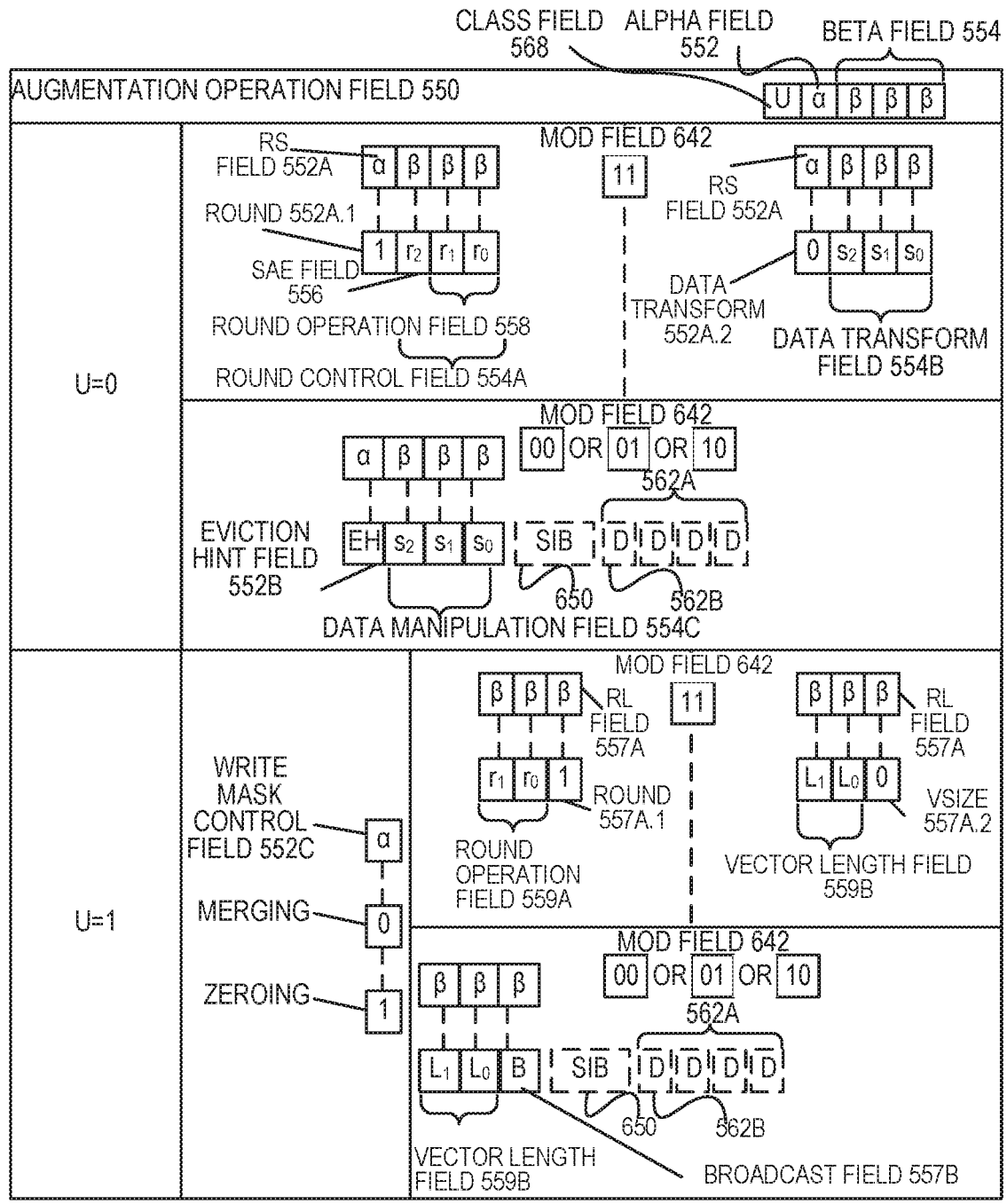

FIG. 6D is a block diagram illustrating the fields of the specific vector friendly instruction format 600 that make up the augmentation operation field 550 according to an embodiment. When the class (U) field 568 contains 0, it signifies EVEX.U0 (class A 568A); when it contains 1, it signifies EVEX.U1 (class B 568B). When U=0 and the MOD field 642 contains 11 (signifying a no memory access operation), the alpha field 552 (EVEX byte 3, bit [7]-EH) is interpreted as the rs field 552A. When the rs field 552A contains a 1 (round 552A.1), the beta field 554 (EVEX byte 3, bits [6:4]-SSS) is interpreted as the round control field 554A. The round control field 554A includes a one bit SAE field 556 and a two bit round operation field 558. When the rs field 552A contains a 0 (data transform 552A.2), the beta field 554 (EVEX byte 3, bits [6:4]-SSS) is interpreted as a three bit data transform field 554B. When U=0 and the MOD field 642 contains 00, 01, or 10 (signifying a memory access operation), the alpha field 552 (EVEX byte 3, bit [7]-EH) is interpreted as the eviction hint (EH) field 552B and the beta field 554 (EVEX byte 3, bits [6:4]-SSS) is interpreted as a three bit data manipulation field 554C.

When U=1, the alpha field 552 (EVEX byte 3, bit [7]-EH) is interpreted as the write mask control (Z) field 552C. When U=1 and the MOD field 642 contains 11 (signifying a no memory access operation), part of the beta field 554 (EVEX byte 3, bit [4]-S0) is interpreted as the RL field 557A; when it contains a 1 (round 557A.1) the rest of the beta field 554 (EVEX byte 3, bit [6-5]-S2-1) is interpreted as the round operation field 559A, while when the RL field 557A contains a 0 (VSIZE 557.A2) the rest of the beta field 554 (EVEX byte 3, bit [6-5]-S2-1) is interpreted as the vector length field 559B (EVEX byte 3, bit [6-5]-L1-0). When U=1 and the MOD field 642 contains 00, 01, or 10 (signifying a memory access operation), the beta field 554 (EVEX byte 3, bits [6:4]-SSS) is interpreted as the vector length field 559B (EVEX byte 3, bit [6-5]-L1-0) and the broadcast field 557B (EVEX byte 3, bit [4]-B).

Register Architecture

Figure 7:
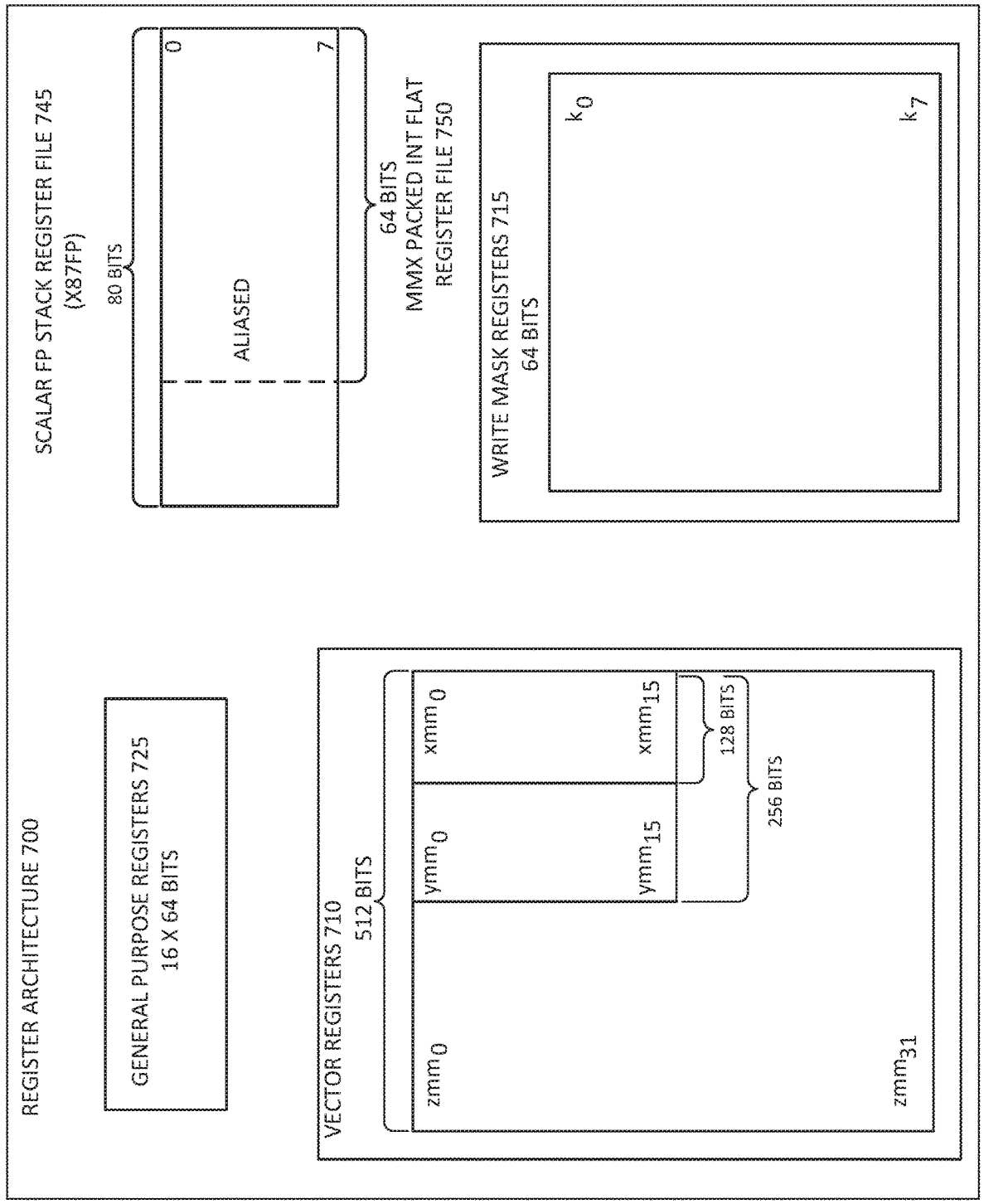
FIG. 7 is a block diagram of a register architecture according to an embodiment.

FIG. 7 is a block diagram of a register architecture 700 according to an embodiment. In the embodiment illustrated, there are 32 vector registers 710 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 600 operates on these overlaid register file as illustrated in the below tables.

| Adjustable Vector Length | Class | Operations | Registers |
|---|---|---|---|
| Instruction Templates that do not include the vector length field 559B | A (FIG. 5A; U = 0) | 510, 515, 525, 530 | zmm registers (the vector length is 64 byte) |
| | B (FIG. 5B; U = 1) | 512 | zmm registers (the vector length is 64 byte) |
| Instruction templates that do include the vector length field 559B | B (FIG. 5B; U = 1) | 517, 527 | zmm, ymm, or xmm registers (the vector length is 64 byte, 32 byte, or 16 byte) depending on the vector length field 559B |

In other words, the vector length field 559B selects between a maximum length and one or more other shorter lengths, where each such shorter length is half the length of the preceding length; and instructions templates without the vector length field 559B operate on the maximum vector length. Further, in an embodiment, the class B instruction templates of the specific vector friendly instruction format 600 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 715—in the embodiment illustrated, there are 8 write mask registers (k0 through k7), each 64 bits in size. In an alternate embodiment, the write mask registers 715 are 16 bits in size. As previously described, in an embodiment, the vector mask register k0 cannot be used as a write mask; when the encoding that would normally indicate k0 is used for a write mask, it selects a hardwired write mask of 0xFFFF, effectively disabling write masking for that instruction.

General-purpose registers 725—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 745, on which is aliased the MMX packed integer flat register file 750—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments may use wider or narrower registers. Additionally, alternative embodiments may use more, less, or different register files and registers.

Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Core architectures are described next, followed by descriptions of processors and computer architectures.

Core Architectures

In-Order and Out-of-Order Core Block Diagram

FIG. 8A is a block diagram illustrating both an in-order pipeline and a register renaming, out-of-order issue/execution pipeline according to embodiments. FIG. 8B is a block diagram illustrating both an embodiment of an in-order architecture core and a register renaming, out-of-order issue/execution architecture core to be included in a processor according to an embodiment. The solid lined boxes in FIGS. 8A-8B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

FIG. 8B shows processor core 890 including a front end unit 830 coupled to an execution engine unit 850, and both are coupled to a memory unit 870. The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, coprocessor core, general purpose computing graphics processing unit (GPGPU) core, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit 840 (or decoder) may decode instructions, and generate as an output one or more micro-operations, micro-code entry points, microinstructions, other instructions, or other control signals, which are decoded from, or which otherwise reflect, or are derived from, the original instructions. The decode unit 840 may be implemented using various different mechanisms. Examples of suitable mechanisms include, but are not limited to, look-up tables, hardware implementations, programmable logic arrays (PLAs), microcode read only memories (ROMs), etc. In an embodiment, the core 890 includes a microcode ROM or other medium that stores microcode for certain macroinstructions (e.g., in decode unit 840 or otherwise within the front end unit 830). The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In an embodiment, the physical register file(s) unit 858 comprises a vector registers unit, a write mask registers unit, and a scalar registers unit. These register units may provide architectural vector registers, vector mask registers, and general purpose registers. The physical register file(s) unit(s) 858 is overlapped by the retirement unit 854 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In an embodiment, the memory access units 864 may include a load unit, a store address unit, and a store data unit, each of which is coupled to the data TLB unit 872 in the memory unit 870. The instruction cache unit 834 is further coupled to a level 2 (L2) cache unit 876 in the memory unit 870. The L2 cache unit 876 is coupled to one or more other levels of cache and eventually to a main memory.

By way of example, the register renaming, out-of-order issue/execution core architecture may implement the pipeline 800 as follows: 1) the instruction fetch 838 performs the fetch and length decoding stages 802 and 804; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 860 perform the execute stage 816; 6) the memory unit 870 and the physical register file(s) unit(s) 858 perform the write back/memory write stage 818; 7) various units may be involved in the exception handling stage 822; and 8) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In an embodiment, the core 890 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 834/874 and a shared L2 cache unit 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific In-Order Core Architecture

FIGS. 9A-9B illustrate a block diagram of a more specific in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 9A is a block diagram of a single processor core, along with its connection to the on-die interconnect network 902 and with its local subset of the Level 2 (L2) cache 904, according to an embodiment. In an embodiment, an instruction decoder 900 supports the x86 instruction set with a packed data instruction set extension. An L1 cache 906 allows low-latency accesses to cache memory into the scalar and vector units. While in one embodiment (to simplify the design), a scalar unit 908 and a vector unit 910 use separate register sets (respectively, scalar registers 912 and vector registers 914) and data transferred between them is written to memory and then read back in from a level 1 (L1) cache 906, alternative embodiments may use a different approach (e.g., use a single register set or include a communication path that allow data to be transferred between the two register files without being written and read back).

The local subset of the L2 cache 904 is part of a global L2 cache that is divided into separate local subsets, one per processor core. Each processor core has a direct access path to its own local subset of the L2 cache 904. Data read by a processor core is stored in its L2 cache subset 904 and can be accessed quickly, in parallel with other processor cores accessing their own local L2 cache subsets. Data written by a processor core is stored in its own L2 cache subset 904 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 9B is an expanded view of part of the processor core in FIG. 9A according to an embodiment. FIG. 9B includes an L1 data cache 906A part of the L1 cache 904, as well as more detail regarding the vector unit 910 and the vector registers 914. Specifically, the vector unit 910 is a 16-wide vector processing unit (VPU) (see the 16-wide ALU 928), which executes one or more of integer, single-precision float, and double-precision float instructions. The VPU supports swizzling the register inputs with swizzle unit 920, numeric conversion with numeric convert units 922A-B, and replication with replication unit 924 on the memory input. Write mask registers 926 allow predicating resulting vector writes.

Figure 10:
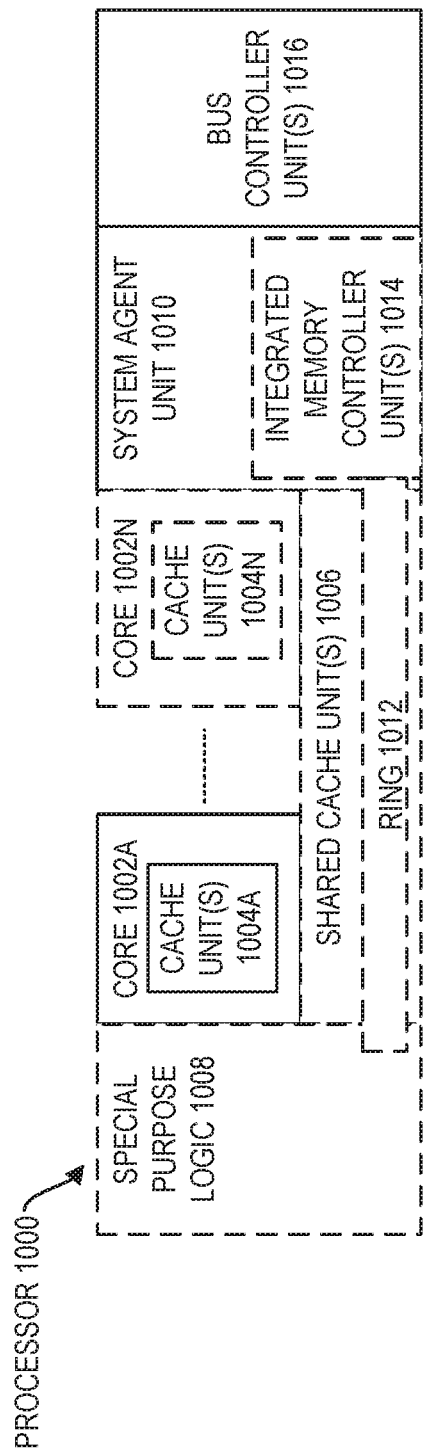
FIG. 10 is a block diagram of a processor that may have more than one core, may have an integrated memory controller, and may have integrated graphics according to an embodiment.

FIG. 10 is a block diagram of a processor 1000 that may have more than one core, may have an integrated memory controller, and may have integrated graphics according to embodiments. The solid lined boxes in FIG. 10 illustrate a processor 1000 with a single core 1002A, a system agent 1010, a set of one or more bus controller units 1016, while the optional addition of the dashed lined boxes illustrates an alternative processor 1000 with multiple cores 1002A-N, a set of one or more integrated memory controller unit(s) 1014 in the system agent unit 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1000 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof. While in one embodiment a ring based interconnect unit 1012 interconnects the integrated graphics logic 1008, the set of shared cache units 1006, and the system agent unit 1010/integrated memory controller unit(s) 1014, alternative embodiments may use any number of well-known techniques for interconnecting such units. In an embodiment, coherency is maintained between one or more cache units 1004A-N and cores 1002A-N.

In some embodiments, one or more of the cores 1002A-N are capable of multi-threading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture instruction set; that is, two or more of the cores 1002A-N may be capable of execution the same instruction set, while others may be capable of executing only a subset of that instruction set or a different instruction set.

Computer Architectures

FIGS. 11-14 are block diagrams of computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 11:
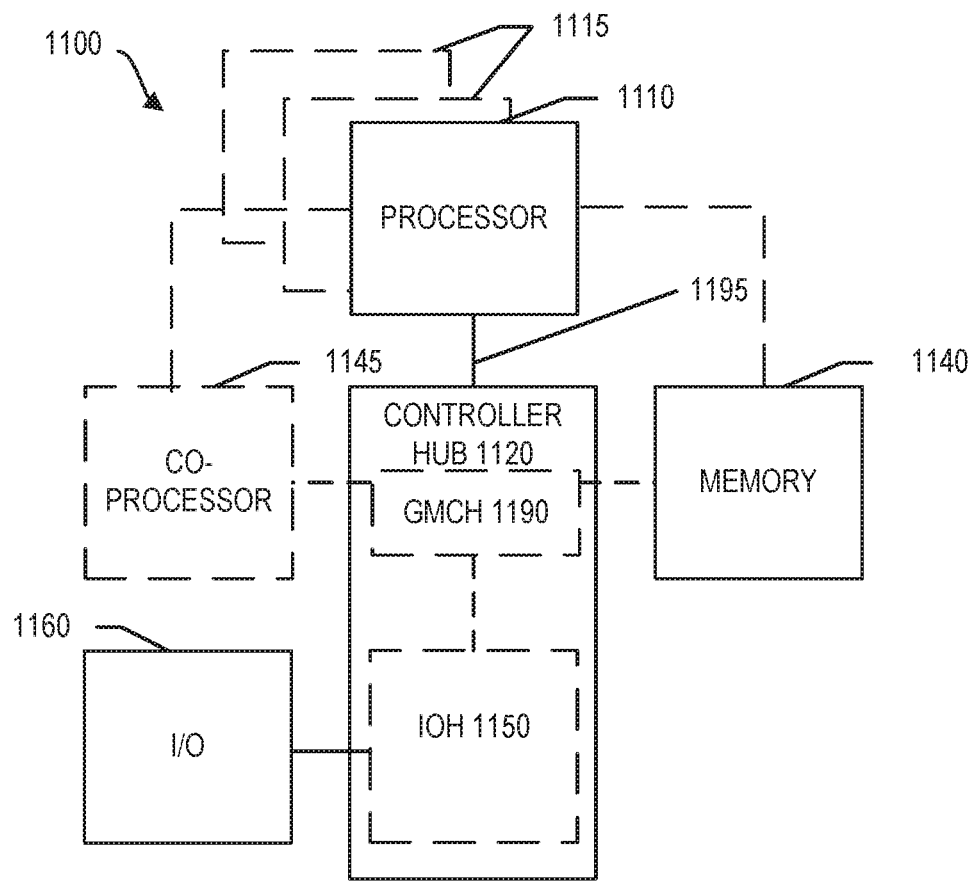
FIGS. 11-14 are block diagrams of computer architectures, according to an embodiment.

Referring now to FIG. 11, shown is a block diagram of a system 1100 according to an embodiment. The system 1100 may include one or more processors 1110, 1115, which are coupled to a controller hub 1120. In an embodiment the controller hub 1120 includes a graphics memory controller hub (GMCH) 1190 and an Input/Output Hub (IOH) 1150 (which may be on separate chips); the GMCH 1190 includes memory and graphics controllers to which are coupled memory 1140 and a coprocessor 1145; the IOH 1150 is couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 in a single chip with the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random access memory (DRAM), phase change memory (PCM), or a combination of the two. For at least one embodiment, the controller hub 1120 communicates with the processor(s) 1110, 1115 via a multi-drop bus, such as a frontside bus (FSB), point-to-point interface such as QuickPath Interconnect (QPI), or similar connection 1195.

In an embodiment, the coprocessor 1145 is a special-purpose processor, such as, for example, a high-throughput MIC processor, a network or communication processor, compression engine, graphics processor, GPGPU, embedded processor, or the like. In an embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In an embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
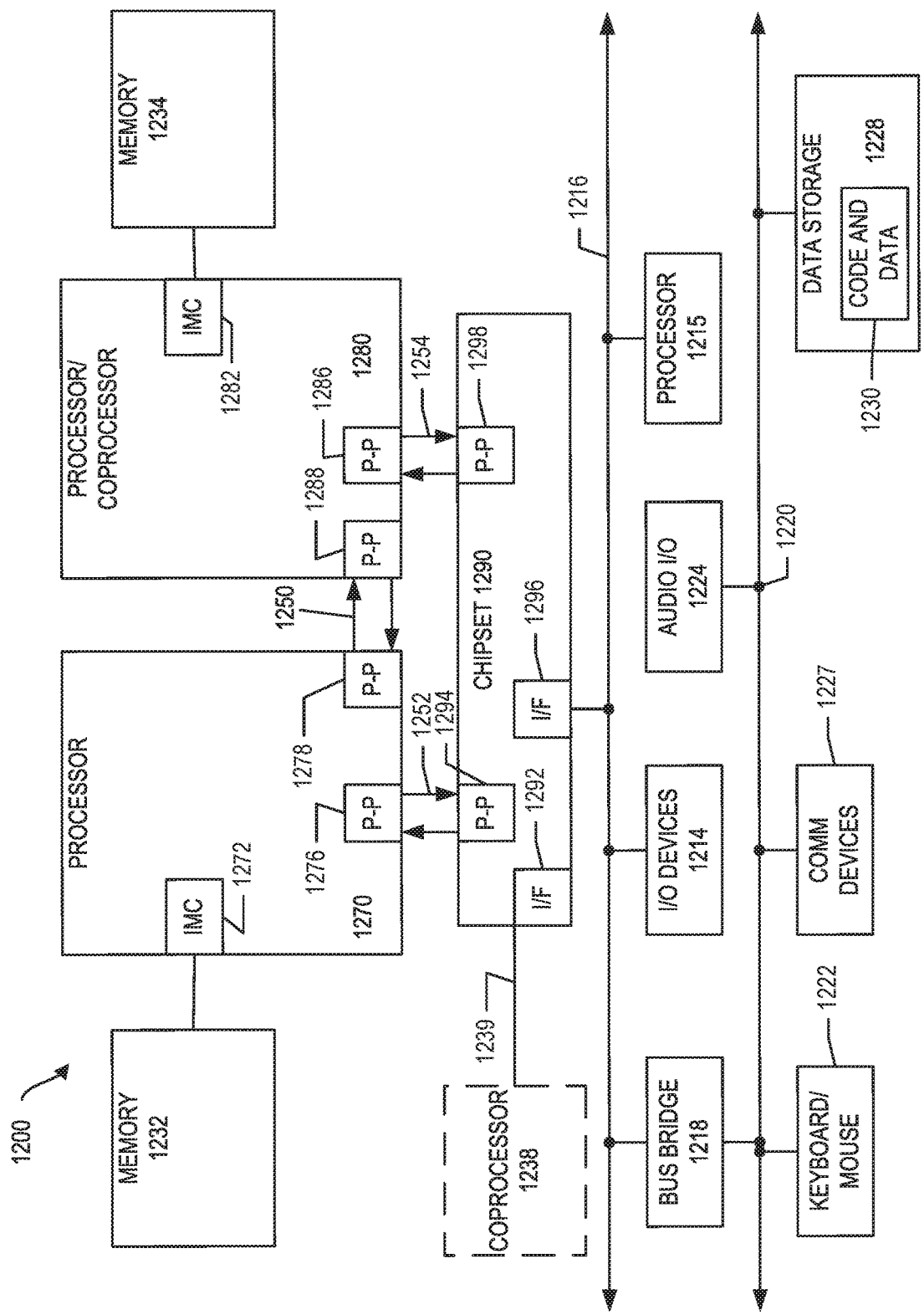

Referring now to FIG. 12, shown is a block diagram of a first more specific system 1200 in accordance with an embodiment. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In an embodiment, processors 1270 and 1280 are respectively processors 1110 and 1115, while coprocessor 1238 is coprocessor 1145. In another embodiment, processors 1270 and 1280 are respectively processor 1110 coprocessor 1145.

Processors 1270 and 1280 are shown including integrated memory controller (IMC) units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 may each exchange information with a chipset 1290 via individual P-P interfaces 1252, 1254 using point to point interface circuits 1276, 1294, 1286, 1298. Chipset 1290 may optionally exchange information with the coprocessor 1238 via a high-performance interface 1239. In an embodiment, the coprocessor 1238 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1290 may be coupled to a first bus 1216 via an interface 1296. In an embodiment, first bus 1216 may be a Peripheral Component Interconnect (PCI) bus, or a bus such as a PCI Express bus or another third generation I/O interconnect bus, although the scope of the present invention is not so limited.

As shown in FIG. 12, various I/O devices 1214 may be coupled to first bus 1216, along with a bus bridge 1218 which couples first bus 1216 to a second bus 1220. In an embodiment, one or more additional processor(s) 1215, such as coprocessors, high-throughput MIC processors, GPGPU's, accelerators (such as, e.g., graphics accelerators or digital signal processing (DSP) units), field programmable gate arrays, or any other processor, are coupled to first bus 1216. In an embodiment, second bus 1220 may be a low pin count (LPC) bus. Various devices may be coupled to a second bus 1220 including, for example, a keyboard and/or mouse 1222, communication devices 1227 and a storage unit 1228 such as a disk drive or other mass storage device which may include instructions/code and data 1230, in an embodiment. Further, an audio I/O 1224 may be coupled to the second bus 1220. Note that other architectures are possible. For example, instead of the point-to-point architecture of FIG. 12, a system may implement a multi-drop bus or other such architecture.

Figure 13:
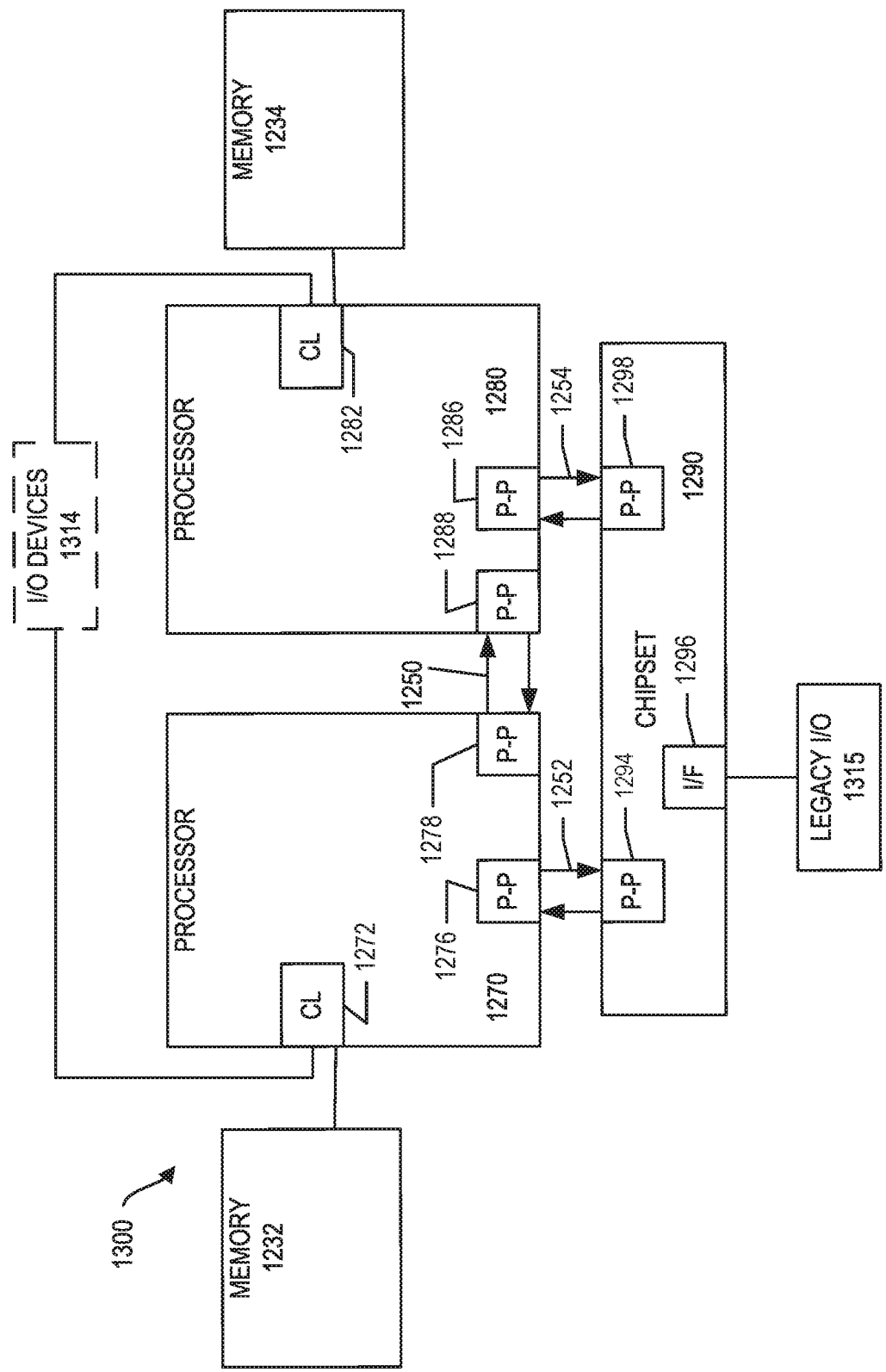

Referring now to FIG. 13, shown is a block diagram of a second more specific system 1300 in accordance with an embodiment. Like elements in FIGS. 12 and 13 bear like reference numerals, and certain aspects of FIG. 12 have been omitted from FIG. 13 in order to avoid obscuring other aspects of FIG. 13.

FIG. 13 illustrates that the processors 1270, 1280 may include integrated memory and I/O control logic ("CL") 1272 and 1282, respectively. Thus, the CL 1272, 1282 include integrated memory controller units and include I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
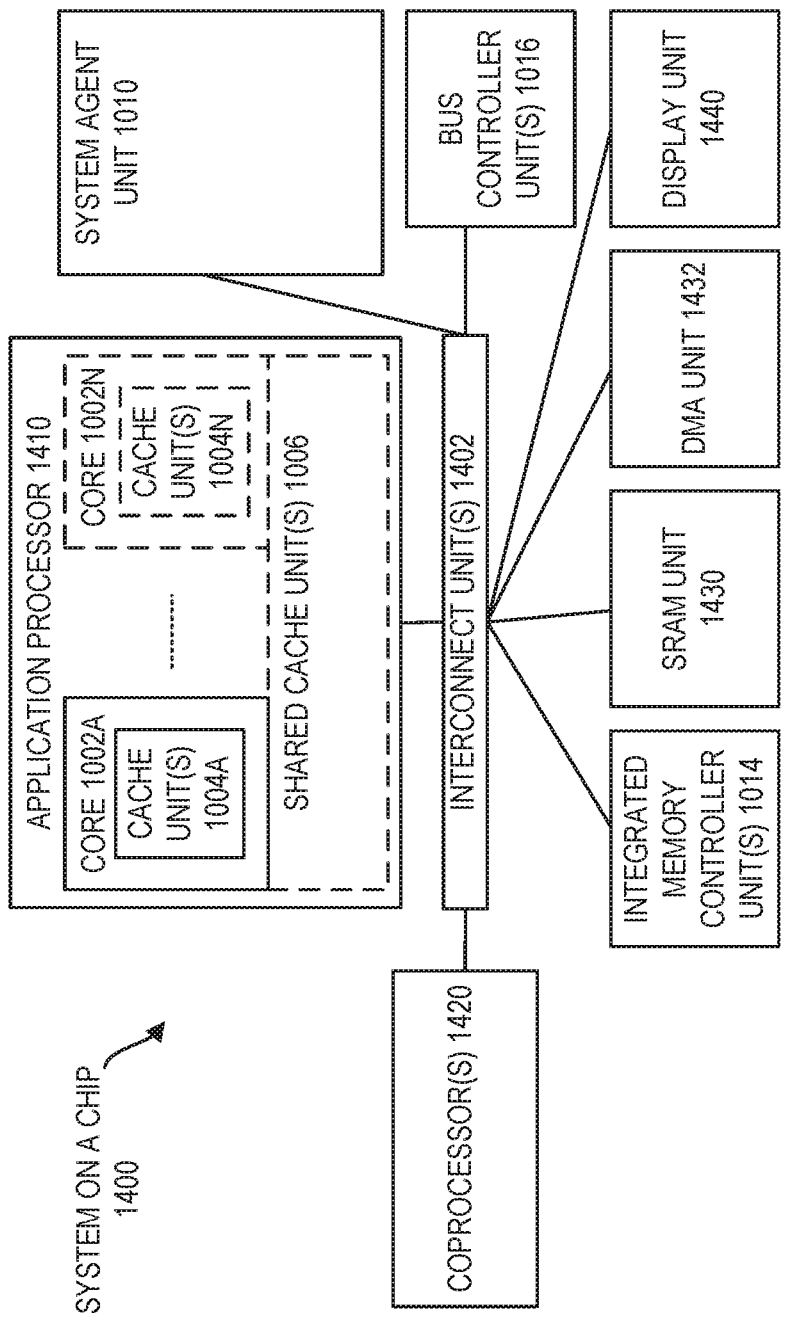

Referring now to FIG. 14, shown is a block diagram of a SoC 1400 in accordance with an embodiment. Similar elements in FIG. 10 bear like reference numerals. Also, dashed lined boxes are optional features on more advanced SoCs. In FIG. 14, an interconnect unit(s) 1402 is coupled to: an application processor 1410 which includes a set of one or more cores 1002A-N with integrated cache units 1004A-N and shared cache unit(s) 1006; a system agent unit 1010; a bus controller unit(s) 1016; an integrated memory controller unit(s) 1014; a set or one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In an embodiment, the coprocessor(s) 1420 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 15:
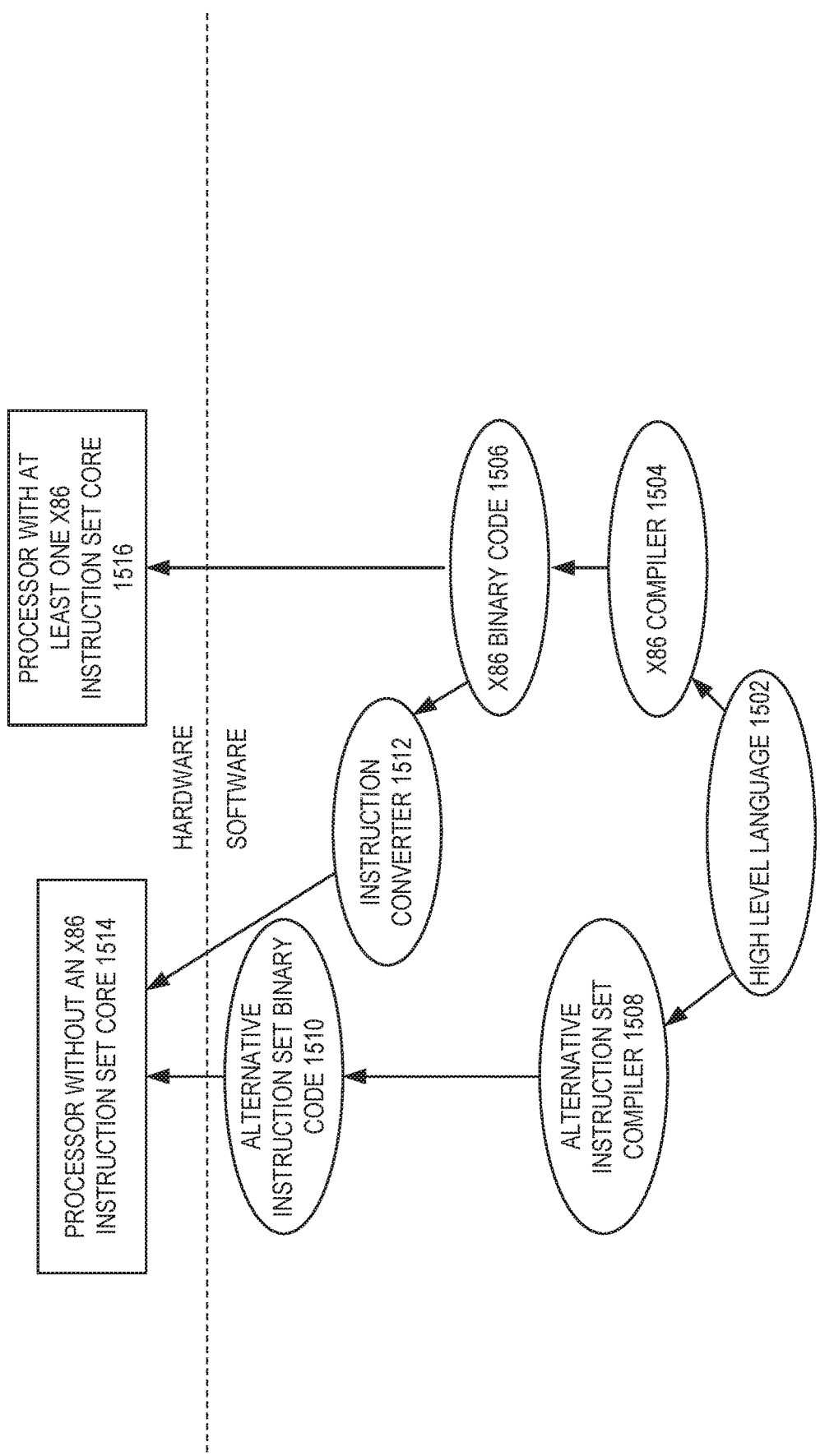
FIG. 15 is a block diagram contrasting the use of a software instruction converter to convert binary instructions in a source instruction set to binary instructions in a target instruction set according to an embodiment.

FIG. 15 is a block diagram contrasting the use of a software instruction converter to convert binary instructions in a source instruction set to binary instructions in a target instruction set according to embodiments. In the illustrated embodiment, the instruction converter is a software instruction converter, although alternatively the instruction converter may be implemented in software, firmware, hardware, or various combinations thereof. FIG. 15 shows a program in a high level language 1502 may be compiled using an x86 compiler 1504 to generate x86 binary code 1506 that may be natively executed by a processor with at least one x86 instruction set core 1516. The processor with at least one x86 instruction set core 1516 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1504 represents a compiler that is operable to generate x86 binary code 1506 (e.g., object code) that can, with or without additional linkage processing, be executed on the processor with at least one x86 instruction set core 1516. Similarly, FIG. 15 shows the program in the high level language 1502 may be compiled using an alternative instruction set compiler 1508 to generate alternative instruction set binary code 1510 that may be natively executed by a processor without at least one x86 instruction set core 1514 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1512 is used to convert the x86 binary code 1506 into code that may be natively executed by the processor without an x86 instruction set core 1514. This converted code is not likely to be the same as the alternative instruction set binary code 1510 because an instruction converter capable of this is difficult to make; however, the converted code will accomplish the general operation and be made up of instructions from the alternative instruction set. Thus, the instruction converter 1512 represents software, firmware, hardware, or a combination thereof that, through emulation, simulation or any other process, allows a processor or other electronic device that does not have an x86 instruction set processor or core to execute the x86 binary code 1506.

Additional Notes & Examples:

Example 1 is an apparatus of a scan controller, the apparatus comprising: memory and circuitry coupled to the memory, the circuitry configured to: in response to a first signal, send a second signal to isolate state retention elements from non-state retention elements in a scan chain of power gating circuitry, cycle through the scan chain obtaining state retention data from the state retention elements; determine an error detection code based on the state retention data; store the error detection code in the memory; and send a third signal, the third signal indicating the error detection code has been determined.

In Example 2, the subject matter of Example 1 includes, wherein the circuitry is further configured to: send a fourth signal to rejoin the state retention elements and the non-state retention together in the scan chain.

In Example 3, the subject matter of Examples 1-2 includes, wherein the error detection code is a first error detection code, and wherein the circuitry is further configured to: in response to a fourth signal, send a fifth signal to isolate state retention elements from non-state retention elements in the scan chain of the power gating circuitry; cycle through the scan chain receiving second state retention data from the state retention elements; determine a second error detection code from the second state retention data; determine whether the first error detection code is equal to the second error detection code; and in response to a determination that the first error detection code is not equal to the second error detection code, send a sixth signal, the sixth signal indicating the second state retention data is corrupted.

In Example 4, the subject matter of Example 3 includes, wherein the circuitry is further configured to: send a seventh signal, the seventh signal indicating the determine whether the first error detection code is equal to the second error detection code is done.

In Example 5, the subject matter of Examples 1-4 includes, wherein the circuitry is further configured to: receive a scan chain size, wherein the scan chain size indicates a number of cycle operations of cycle operations of the cycle through the scan chain; and for each cycle operation of the cycle operations of the cycle through the scan chain, determine a value of the error detection code based on a previous value of the error detection code and a value of a corresponding state retention datum of the state retention data sent to the circuitry during a corresponding cycle operation of the cycle through the scan chain.

In Example 6, the subject matter of Examples 1-5 includes, wherein the state retention data comprises one or more of the following group: register values, latches values, finite state machines (FSMs) values, internal flag values, status values, and logic enabling safety mechanisms values.

In Example 7, the subject matter of Examples 1-6 includes, wherein the first signal is received from a power-gating controller and the third signal is sent to the power-gating controller.

In Example 8, the subject matter of Examples 1-7 includes, wherein the scan controller is part of a system on a chip (SoC), and wherein the scan controller is part of a power always portion of the SoC and the power-gating circuitry is part of a power-gating portion of the SoC.

In Example 9, the subject matter of Examples 1-8 includes, wherein the first signal is a power-gating sleep request and the third signal is a power-gating sleep acknowledgement.

In Example 10, the subject matter of Examples 1-9 includes, wherein send the second signal further comprises: send the second signal to 2:1 multiplexers to isolate state retention elements from non-state retention elements in the scan chain of power gating circuitry. In Example 11, the subject matter of Example 10 includes, multiplexers for each state retention element of the state retention elements.

In Example 12, the subject matter of Examples 1-11 includes, wherein the cycle comprises a plurality of cycle operations, and wherein cycle through the scan chain obtaining state retention data from the state retention elements further includes: cycle through the scan chain obtaining state retention data from the state retention elements, wherein state retention data from one state retention element of the state retention elements is received by the circuitry during each operation of the plurality of cycle operations.

Example 13 is an integrated circuit comprising: a substrate comprising a circuit, the circuit comprising a scan controller, the scan controller comprising: memory and circuitry coupled to the memory, the circuitry configured to: in response to a first signal, send a second signal to isolate state retention elements from non-state retention elements in a scan chain of power gating circuitry; cycle through the scan chain receiving state retention data from the state retention elements; determine an error detection code from the state retention data; store the error detection code in the memory; and send a third signal, the third signal indicating the error detection code has been determined.

In Example 14, the subject matter of Example 13 includes, wherein the circuitry is further configured to: send a fourth signal to rejoin the state retention elements and the non-state retention together in the scan chain.

In Example 15, the subject matter of Examples 13-14 includes, wherein the error detection code is a first error detection code, and wherein the circuitry is further configured to: in response to a fourth signal, send a fifth signal to isolate state retention elements from non-state retention elements in the scan chain of the power gating circuitry; cycle through the scan chain receiving second state retention data from the state retention elements; determine a second error detection code from the second state retention data; determine whether the first error detection code is equal to the second error detection code; and in response to a determination that the first error detection code is not equal to the second error detection code, send a sixth signal, the sixth signal indicating the second state retention data is corrupted.

In Example 16, the subject matter of Examples 13-15 includes, wherein the circuitry is further configured to: send a seventh signal, the seventh signal indicating the determine whether the first error detection code is equal to the second error detection code is done.

In Example 17, the subject matter of Examples 13-16 includes, wherein the circuitry is further configured to: receive a scan chain size, wherein the scan chain size indicates a number of cycles of the cycle through the scan chain; and for each cycle of the cycle through the scan chain, determine a value of the error detection code based on a previous value of the error detection code and a value of a corresponding state retention datum of the state retention data sent to the circuitry during a corresponding cycle of the cycle through the scan chain.

In Example 18, the subject matter of Examples 13-17 includes, wherein the state retention data comprises one or more of the following group: register values, latches values, finite state machines (FSMs) values, internal flag values, status values, and logic enabling safety mechanisms values.

In Example 19, the subject matter of Examples 13-18 includes, wherein the first signal is received from a power-gating controller and the third signal is sent to the power-gating controller.

In Example 20, the subject matter of Examples 13-19 includes, wherein the scan controller is part of a system on a chip (SoC), and wherein the scan controller is part of a power always portion of the SoC and the power-gating circuitry is part of a power-gating portion of the SoC.

In Example 21, the subject matter of Examples 13-20 includes, wherein the first signal is a power-gating sleep request and the third signal is a power-gating sleep acknowledgement.

In Example 22, the subject matter of Examples 13-21 includes, wherein send the second signal further comprises: send the second signal to 2:1 multiplexers to isolate state retention elements from non-state retention elements in the scan chain of power gating circuitry.

In Example 23, the subject matter of Example 22 includes, multiplexers for each state retention element of the state retention elements.

In Example 24, the subject matter of Examples 13-23 includes, wherein cycle through the scan chain receiving state retention data from the state retention elements further comprises: cycle through the scan chain receiving state retention data from the state retention elements, wherein state retention data from one state retention element of the state retention elements is received by the circuitry during each cycle of the cycle through the scan chain.

Example 25 is at least one machine-readable medium including instructions for a scan controller, which when executed on a machine, cause the machine to perform operations comprising: sending a second signal to isolate state retention elements from non-state retention elements in a scan chain of power gating circuitry, in response to a first signal, cycling through the scan chain receiving state retention data from the state retention elements; determining an error detection code from the state retention data; storing the error detection code in the memory; and sending a third signal, the third signal indicating the error detection code has been determined.

In Example 26, the subject matter of Example 25 includes, wherein the operations further comprise: sending a fourth signal to rejoin the state retention elements and the non-state retention together in the scan chain.

In Example 27, the subject matter of Examples 25-26 includes, wherein the error detection code is a first error detection code, and wherein the operations further comprise: sending a fifth signal to isolate state retention elements from non-state retention elements in the scan chain of the power gating circuitry, in response to a fourth signal; cycling through the scan chain receiving second state retention data from the state retention elements; determining a second error detection code from the second state retention data; determining whether the first error detection code is equal to the second error detection code; and sending a sixth signal, the sixth signal indicating the second state retention data is corrupted, in response to a determination that the first error detection code is not equal to the second error detection code.

In Example 28, the subject matter of Examples 25-27 includes, wherein the operations further comprise: sending a seventh signal, the seventh signal indicating the determine whether the first error detection code is equal to the second error detection code is done.

In Example 29, the subject matter of Examples 25-28 includes, wherein the operations further comprise: receiving a scan chain size, wherein the scan chain size indicates a number of cycles of the cycle through the scan chain; and for each cycle of the cycle through the scan chain, determining a value of the error detection code based on a previous value of the error detection code and a value of a corresponding state retention datum of the state retention data sent to the circuitry during a corresponding cycle of the cycle through the scan chain.

In Example 30, the subject matter of Examples 25-29 includes, wherein the state retention data comprises one or more of the following group: register values, latches values, finite state machines (FSMs) values, internal flag values, status values, and logic enabling safety mechanisms values.

In Example 31, the subject matter of Examples 25-30 includes, wherein the first signal is received from a power-gating controller and the third signal is sent to the power-gating controller.

In Example 32, the subject matter of Examples 25-31 includes, wherein the scan controller is part of a system on a chip (SoC), and wherein the scan controller is part of a power always portion of the SoC and the power-gating circuitry is part of a power-gating portion of the SoC.

In Example 33, the subject matter of Examples 25-32 includes, wherein the first signal is a power-gating sleep request and the third signal is a power-gating sleep acknowledgement.

In Example 34, the subject matter of Examples 25-33 includes, wherein sending the second signal further comprises: sending the second signal to 2:1 multiplexers to isolate state retention elements from non-state retention elements in the scan chain of power gating circuitry.

In Example 35, the subject matter of Example 34 includes, multiplexers for each state retention element of the state retention elements.

In Example 36, the subject matter of Examples 25-35 includes, wherein cycling through the scan chain receiving state retention data from the state retention elements further comprises: cycling through the scan chain receiving state retention data from the state retention elements, wherein state retention data from one state retention element of the state retention elements is received by the circuitry during each cycle of the cycle through the scan chain.

Example 37 is a method performed by an apparatus of a scan controller, the method comprising: sending a second signal to isolate state retention elements from non-state retention elements in a scan chain of power gating circuitry, in response to a first signal; cycling through the scan chain receiving state retention data from the state retention elements; determining an error detection code from the state retention data; storing the error detection code in the memory; and sending a third signal, the third signal indicating the error detection code has been determined.

In Example 38, the subject matter of Example 37 includes, wherein the method further comprises: sending a fourth signal to rejoin the state retention elements and the non-state retention together in the scan chain.

In Example 39, the subject matter of Examples 37-38 includes, wherein the error detection code is a first error detection code, and wherein the method further comprises: sending a fifth signal to isolate state retention elements from non-state retention elements in the scan chain of the power gating circuitry, in response to a fourth signal; cycling through the scan chain receiving second state retention data from the state retention elements; determining a second error detection code from the second state retention data; determining whether the first error detection code is equal to the second error detection code; and sending a sixth signal, the sixth signal indicating the second state retention data is corrupted, in response to a determination that the first error detection code is not equal to the second error detection code.

In Example 40, the subject matter of Examples 37-39 includes, wherein the method further comprises: sending a seventh signal, the seventh signal indicating the determine whether the first error detection code is equal to the second error detection code is done.

In Example 41, the subject matter of Examples 37-40 includes, wherein the operations further comprise: receiving a scan chain size, wherein the scan chain size indicates a number of cycles of the cycle through the scan chain; and for each cycle of the cycle through the scan chain, determining a value of the error detection code based on a previous value of the error detection code and a value of a corresponding state retention datum of the state retention data sent to the circuitry during a corresponding cycle of the cycle through the scan chain.

In Example 42, the subject matter of Examples 37-41 includes, wherein the state retention data comprises one or more of the following group: register values, latches values, finite state machines (FSMs) values, internal flag values, status values, and logic enabling safety mechanisms values.

In Example 43, the subject matter of Examples 37-42 includes, wherein the first signal is received from a power-gating controller and the third signal is sent to the power-gating controller.

In Example 44, the subject matter of Examples 37-43 includes, wherein the scan controller is part of a system on a chip (SoC), and wherein the scan controller is part of a power always portion of the SoC and the power-gating circuitry is part of a power-gating portion of the SoC.

In Example 45, the subject matter of Examples 37-44 includes, wherein the first signal is a power-gating sleep request and the third signal is a power-gating sleep acknowledgement.

In Example 46, the subject matter of Examples 37-45 includes, wherein sending the second signal further comprises: sending the second signal to 2:1 multiplexers to isolate state retention elements from non-state retention elements in the scan chain of power gating circuitry.

In Example 47, the subject matter of Example 46 includes, multiplexers for each state retention element of the state retention elements.

In Example 48, the subject matter of Examples 37-47 includes, wherein cycling through the scan chain receiving state retention data from the state retention elements further comprises: cycling through the scan chain receiving state retention data from the state retention elements, wherein state retention data from one state retention element of the state retention elements is received by the circuitry during each cycle of the cycle through the scan chain.

Example 49 is an apparatus of a scan controller, the apparatus comprising: means for sending a second signal to isolate state retention elements from non-state retention elements in a scan chain of power gating circuitry, in response to a first signal; means for cycling through the scan chain receiving state retention data from the state retention elements; means for determining an error detection code based on the state retention data; means for storing the error detection code in the memory; and means for sending a third signal, the third signal indicating the error detection code has been determined.

In Example 50, the subject matter of Example 49 includes, wherein the apparatus further comprises: means for sending a fourth signal to rejoin the state retention elements and the non-state retention together in the scan chain.

In Example 51, the subject matter of Examples 49-50 includes, wherein the error detection code is a first error detection code, and wherein the apparatus further comprises: in response to a fourth signal, means for sending a fifth signal to isolate state retention elements from non-state retention elements in the scan chain of the power gating circuitry; means for cycling through the scan chain receiving second state retention data from the state retention elements; means for determining a second error detection code from the second state retention data; means for determining whether the first error detection code is equal to the second error detection code; and in response to a determination that the first error detection code is not equal to the second error detection code, means for sending a sixth signal, the sixth signal indicating the second state retention data is corrupted.

In Example 52, the subject matter of Examples 49-51 includes, wherein the apparatus further comprises: means for sending a seventh signal, the seventh signal indicating the determine whether the first error detection code is equal to the second error detection code is done.

In Example 53, the subject matter of Examples 49-52 includes, wherein the apparatus further comprises: means for receiving a scan chain size, wherein the scan chain size indicates a number of cycles of the cycle through the scan chain; and for each cycle of the cycle through the scan chain, means for determining a value of the error detection code based on a previous value of the error detection code and a value of a corresponding state retention datum of the state retention data sent to the circuitry during a corresponding cycle of the cycle through the scan chain.

In Example 54, the subject matter of Examples 49-53 includes, wherein the state retention data comprises one or more of the following group: register values, latches values, finite state machines (FSMs) values, internal flag values, status values, and logic enabling safety mechanisms values.

In Example 55, the subject matter of Examples 49-54 includes, wherein the first signal is received from a power-gating controller and the third signal is sent to the power-gating controller.

In Example 56, the subject matter of Examples 49-55 includes, wherein the scan controller is part of a system on a chip (SoC), and wherein the scan controller is part of a power always portion of the SoC and the power-gating circuitry is part of a power-gating portion of the SoC.

In Example 57, the subject matter of Examples 49-56 includes, wherein the first signal is a power-gating sleep request and the third signal is a power-gating sleep acknowledgement.

In Example 58, the subject matter of Examples 49-57 includes, wherein means for sending the second signal further comprises: means for sending the second signal to 2:1 multiplexers to isolate state retention elements from non-state retention elements in the scan chain of power gating circuitry.

In Example 59, the subject matter of Example 58 includes, multiplexers for each state retention element of the state retention elements.

In Example 60, the subject matter of Examples 49-59 includes, wherein means for cycling through the scan chain receiving state retention data from the state retention elements further comprises: means for cycling through the scan chain receiving state retention data from the state retention elements, wherein state retention data from one state retention element of the state retention elements is received by the circuitry during each cycle of the cycle through the scan chain.

Example 61 is at least one machine-readable medium including instructions that, when executed by processing circuitry, cause the processing circuitry to perform operations to implement of any of Examples 1-60.

Example 62 is an apparatus comprising means to implement of any of Examples 1-60. Example 63 is a system to implement of any of Examples 1-60. Example 64 is a method to implement of any of Examples 1-60.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus of a scan controller, the apparatus comprising:
    memory and circuitry coupled to the memory, the circuitry configured to:
    in response to a first signal, send a second signal to isolate state retention elements from non-state retention elements in a scan chain of power gating circuitry, the scan chain of power gating circuitry comprising state retention elements and non-state retention elements joined in a serial chain;
    cycle through the scan chain obtaining state retention data from the state retention elements;
    determine an error detection code based on the state retention data;
    store the error detection code in the memory; and
    send a third signal, the third signal indicating that the error detection code has been determined.

2. The apparatus of claim 1, wherein the circuitry is further configured to:
    send a fourth signal to rejoin the state retention elements and the non-state retention together in the scan chain.

3. The apparatus of claim 1, wherein the error detection code is a first error detection code, and wherein the circuitry is further configured to:
    in response to a fourth signal, send a fifth signal to isolate state retention elements from non-state retention elements in the scan chain of the power gating circuitry;
    cycle through the scan chain obtaining second state retention data from the state retention elements;
    determine a second error detection code from the second state retention data;
    determine whether the first error detection code is equal to the second error detection code; and
    in response to a determination that the first error detection code is not equal to the second error detection code, send a sixth signal, the sixth signal indicating the second state retention data is corrupted.

4. The apparatus of claim 3, wherein the circuitry is further configured to:
    send a seventh signal, the seventh signal indicating the determining of whether the first error detection code is equal to the second error detection code is done.

5. The apparatus of claim 1; wherein the circuitry is further configured to:
    receive a scan chain size, wherein the scan chain size indicates a number of cycle operations of cycle operations of the cycle through the scan chain; and
    for each cycle operation of the cycle operations of the cycle through the scan chain, determine a value of the error detection code based on a previous value of the error detection code and a value of a corresponding state retention datum of the state retention data sent to the circuitry during a corresponding cycle operation of the cycle through the scan chain.

6. The apparatus of claim 1, wherein the state retention data comprises one or more of the following group: register values, latches values, finite state machines (FSMs) values, internal flag values, status values, and logic enabling safety mechanisms values.

7. The apparatus of claim 1; wherein the first signal is received from a power-gating controller and the third signal is sent to the power-gating controller.

8. The apparatus of claim 1, wherein the scan controller is part of a system on a chip (SoC), and wherein the scan controller is part of a power always portion of the SoC and the power-gating circuitry is part of a power-gating portion of the SoC.

9. The apparatus of claim 1, wherein the first signal is a power-gating sleep request and the third signal is a power-gating sleep acknowledgement.

10. The apparatus of claim 1, wherein send the second signal further comprises:
    send the second signal to 2:1 multiplexers to isolate state retention elements from non-state retention elements in the scan chain of power gating circuitry.

11. The apparatus of claim 10, wherein the second signal is sent to one 2:1 multiplexer of the 2:1 multiplexers for each state retention element of the state retention elements.

12. The apparatus of claim 1, wherein the cycle comprises a plurality of cycle operations, and wherein cycle through the scan chain obtaining state retention data from the state retention elements further comprises:
    cycle through the scan chain obtaining state retention data from the state retention elements, wherein state retention data from one state retention element of the state retention elements is received by the circuitry during each operation of the plurality of cycle operations.

13. An integrated circuit comprising:
    a substrate comprising a circuit, the circuit comprising a scan controller, the scan controller comprising: memory and circuitry coupled to the memory, the circuitry configured to:
    in response to a first signal, send a second signal to isolate state retention elements from non-state retention elements in a scan chain of power gating circuitry;
    cycle through the scan chain obtaining state retention data from the state retention elements;
    determine an error detection code from the state retention data;
    store the error detection code in the memory; and
    send a third signal, the third signal indicating that the error detection code has been determined.

14. The integrated circuit of claim 13, wherein the circuitry is further configured to:
    send a fourth signal to rejoin the state retention elements and the non-state retention together in the scan chain.

15. The integrated circuit of claim 13, wherein the error detection code is a first error detection code, and wherein the circuitry is further configured to:

in response to a fourth signal, send a fifth signal to isolate state retention elements from non-state retention elements in the scan chain of the power gating circuitry;
cycle through the scan chain obtaining second state retention data from the state retention elements;
determine a second error detection code from the second state retention data;
determine whether the first error detection code is equal to the second error detection code; and
in response to a determination that the first error detection code is not equal to the second error detection code, send a sixth signal, the sixth signal indicating that the second state retention data is corrupted.

16. The integrated circuit of claim 13, wherein the circuitry is further configured to:
send a seventh signal, the seventh signal indicating the determine whether the first error detection code is equal to the second error detection code is done.

17. At least one non-transitory machine-readable medium including instructions for a scan controller, which when executed on a machine, cause the machine to perform operations comprising:
sending a second signal to isolate state retention elements from non-state retention elements in a scan chain of power gating circuitry, in response to a first signal, the scan chain of power gating circuitry comprising state retention elements and non-state retention elements joined in a serial chain;
cycling through the scan chain obtaining state retention data from the state retention elements;
determining an error detection code from the state retention data;
storing the error detection code in the memory; and
sending a third signal, the third signal indicating that the error detection code has been determined.

18. The at least one non-transitory machine-readable medium of claim 17, wherein the operations further comprise:
sending a fourth signal to rejoin the state retention elements and the non-state retention together in the scan chain.

19. The at least one non-transitory machine-readable medium of claim 17, wherein the error detection code is a first error detection code, and wherein the operations further comprise:
sending a fifth signal to isolate state retention elements from non-state retention elements in the scan chain of the power gating circuitry, in response to a fourth signal;
cycling through the scan chain obtaining second state retention data from the state retention elements;
determining a second error detection code from the second state retention data;
determining whether the first error detection code is equal to the second error detection code; and
sending a sixth signal, the sixth signal indicating that the second state retention data is corrupted, in response to a determination that the first error detection code is not equal to the second error detection code.

20. The at least one non-transitory machine-readable medium of claim 17, wherein the operations further comprise:
sending a seventh signal, the seventh signal indicating the determine whether the first error detection code is equal to the second error detection code is done.

21. The at least one non-transitory machine-readable medium of claim 17, wherein the operations further comprise:
receiving a scan chain size, wherein the scan chain size indicates a number of cycle operations of cycle operations of the cycle through the scan chain; and
for each cycle operation of the cycle operations of the cycle through the scan chain, determine a value of the error detection code based on a previous value of the error detection code and a value of a corresponding state retention datum of the state retention data sent to the circuitry during a corresponding cycle operation of the cycle through the scan chain.

22. A method performed by an apparatus of a scan controller; the method comprising:
sending a second signal to isolate state retention elements from non-state retention elements in a scan chain of power gating circuitry, in response to a first signal, the scan chain of power gating circuitry comprising state retention elements and non-state retention elements joined in a serial chain;
cycling through the scan chain obtaining state retention data from the state retention elements;
determining an error detection code from the state retention data;
storing the error detection code in the memory; and
sending a third signal, the third signal indicating that the error detection code has been determined.

23. The method of claim 22, wherein the method further comprises:
sending a fourth signal to rejoin the state retention elements and the non-state retention together in the scan chain.

24. The method of claim 22, wherein the error detection code is a first error detection code, and wherein the method further comprises:
sending a fifth signal to isolate state retention elements from non-state retention elements in the scan chain of the power gating circuitry, in response to a fourth signal;
cycling through the scan chain receiving second state retention data from the state retention elements;
determining a second error detection code from the second state retention data;
determining whether the first error detection code is equal to the second error detection code; and
sending a sixth signal, the sixth signal indicating the second state retention data is corrupted, in response to a determination that the first error detection code is not equal to the second error detection code.

25. The method of claim 22, wherein the method further comprises:
sending a seventh signal, the seventh signal indicating the determine whether the first error detection code is equal to the second error detection code is done.

* * * * *